(12) United States Patent
    Kim

(10) Patent No.:    US 12,684,955 B2
(45) Date of Patent:        Jul. 14, 2026

(54) LIGHT EMITTING DISPLAY DEVICE

(71) Applicant: LG Display Co., Ltd., Seoul (KR)

(72) Inventor: AhnKi Kim, Paju-si (KR)

(73) Assignee: LG Display Co., Ltd., Seoul (KR)

( * ) Notice:    Subject to any disclaimer, the term of this patent is extended or adjusted under 35 U.S.C. 154(b) by 402 days.

(21) Appl. No.: 18/365,151

(22) Filed:    Aug. 3, 2023

(65)              Prior Publication Data

US 2024/0049517 A1      Feb. 8, 2024

(30)        Foreign Application Priority Data

Aug. 8, 2022    (KR) ........................ 10-2022-0098698

(51) Int. Cl.
    *H10K 59/122*        (2023.01)
    *H10K 59/124*        (2023.01)
    *H10K 59/131*        (2023.01)
    *H10K 59/38*          (2023.01)
    *H10K 59/80*          (2023.01)
(52) U.S. Cl.
    CPC ......... *H10K 59/122* (2023.02); *H10K 59/124* (2023.02); *H10K 59/131* (2023.02); *H10K 59/38* (2023.02); *H10K 59/873* (2023.02); *H10K 59/878* (2023.02)
(58) Field of Classification Search
    CPC ............................. H10K 59/122; H10K 59/38
    USPC .................................................. 313/498–512
    See application file for complete search history.

(56)              References Cited

U.S. PATENT DOCUMENTS

|   |   |   |   |
|---|---|---|---|
| 9,748,318 | B2 | 8/2017 | Shim et al. |
| 10,490,768 | B2 | 11/2019 | Baik et al. |
| 2016/0293888 | A1 | 10/2016 | Shim et al. |
| 2018/0123081 | A1 | 5/2018 | Baik et al. |
| 2020/0219951 | A1* | 7/2020 | Ukigaya ................ H10K 50/11 |
| 2021/0335943 | A1* | 10/2021 | Song .................. H10K 59/1275 |
| 2022/0115469 | A1* | 4/2022 | Huang ............. H10K 59/80521 |

FOREIGN PATENT DOCUMENTS

| KR | 10-2016-0072010 A | 6/2016 |
|---|---|---|
| KR | 10-2016-0119301 A | 10/2016 |
| KR | 10-2018-0013226 A | 2/2018 |
| KR | 10-2018-0047270 A | 5/2018 |

OTHER PUBLICATIONS

Ministry of Intellectual Property of Korea, Office Action, Korean Patent Application No. 10-2022-0098698, Jan. 21, 2026, 15 pages.

* cited by examiner

*Primary Examiner* — Christopher M Raabe
(74) *Attorney, Agent, or Firm* — Fenwick & West LLP

(57)              ABSTRACT

A light emitting display device according to the present disclosure comprises: a first pixel and a second pixel disposed on a substrate; a first electrode disposed in each of the first pixel and the second pixel; a trench disposed between the first pixel and the second pixel; a bank disposed at circumferences of the first pixel and inside of the trench; and an emission layer on the first electrode and an upper surface of the bank.

19 Claims, 17 Drawing Sheets

FIG. 9

LIGHT EMITTING DISPLAY DEVICE

CROSS-REFERENCE TO RELATED APPLICATIONS

This application claims the benefit of the Korean Patent Application No. 10-2022-0098698 filed on Aug. 8, 2022, which is hereby incorporated by reference as if fully set forth herein.

BACKGROUND

Field of the Invention

The present disclosure relates to a light emitting display device. Especially, the present disclosure relates to a top emission type light emitting display device that suppresses external light reflection and prevents horizontal leakage current.

Discussion of the Related Art

A light emitting display device may have a structure in which a plurality of pixel areas including light emitting diodes or light emitting layers is disposed. As the density of pixels increases, the distance between pixels decreases and distortion of pixel information due to leakage current may occur between horizontally adjacent pixels. In order to ensure excellent display quality, it is necessary to develop a light emitting display device having a structure for suppressing leakage current (or lateral leakage current) between pixels.

In addition, the light emitting display device may have a structure in which a polarizing element is disposed to suppress reflection of external lights. The polarizing element for suppressing external light reflection may have a problem of reducing the brightness of the lights provided by the display device, and also have a problem of being an expensive element. Therefore, there is a need to develop a structure of a light emitting display device for suppressing reflection of external lights without adding a polarizing element.

SUMMARY

The purpose of the present disclosure, as for solving the problems described above, is to provide a light emitting display device having a structure for improving display quality by suppressing reflection of external lights.

Some embodiments of the present disclosure may be directed to providing a light emitting display device for minimizing or preventing degradation of display quality due to reflection of external lights at an anode electrode.

Some embodiments of the present disclosure may be directed to providing a light emitting device for minimizing or preventing degradation of display quality due to leakage current between pixels.

Some embodiments of the present disclosure may be directed to providing a light emitting display device capable of minimizing or preventing reflection of external lights in a trench area for preventing leakage current between pixels.

In order to accomplish the above mentioned purposes of the present disclosure, a light emitting display device according to the present disclosure comprises: a first pixel and a second pixel disposed on a substrate; a first electrode disposed in each of the first pixel and the second pixel; a trench disposed between the first pixel and the second pixel;

a bank disposed at circumferences of the first pixel and inside of the trench; and an emission layer on the first electrode and an upper surface of the bank.

In an example embodiment, the light emitting display device further comprises: a second electrode disposed on the emission layer; an encapsulation layer disposed on the second electrode; a filling layer disposed on the encapsulation layer; and an upper substrate disposed on the filling layer.

In an example embodiment, the upper substrate includes: a first color filter corresponding to the first pixel and disposed on the inner surface of the upper substrate; and a second color filter corresponding to the second pixel. The first color filter and the second color filter are stacked at areas corresponding to the trench.

Furthermore, a light emitting display device according to the present disclosure comprises: a pixel on a substrate; a first electrode in the pixel; a trench surrounding the pixel; an emission layer on the first electrode; a second electrode on the emission layer; and an insulating layer at the trench and around the trench. the first electrode has a circumference abutting to a side wall of the trench, and electrically separates from the second electrode.

In an example embodiment, the emission layer is disconnected by the trench.

In an example embodiment, the light emitting display device further comprises: a planarization layer between the substrate and the first electrode. The trench is formed at the planarization layer.

In an example embodiment, a side wall of the trench is inclined from the upper surface of the planarization layer.

In an example embodiment, a circumference of the first electrode covers a side wall of the trench inclined from the upper surface of the planarization layer, and is covered by the insulating layer.

In an example embodiment, the planarization layer includes: a first planarization layer between the substrate and the first electrode; and a second planarization layer between the first planarization layer and the first electrode. The trench is formed at the second planarization layer.

In an example embodiment, a circumference of the first electrode covers the side wall of the trench slanted from an upper surface of the second planarization layer. The insulating layer covers a circumference of the first electrode and the second planarization layer exposed from the trench.

In an example embodiment, the trench surrounds the first electrode.

In an example embodiment, the first electrode is separated per each pixel by the trench. the emission layer is separated by trench. The second electrode connects two neighboring pixels and the trench between the two neighboring pixels.

In an example embodiment, the first electrode includes: a reflection layer on the substrate; a transparent layer on the first electrode; a transparent layer on the first electrode; and a semi-transparent layer on the second electrode.

In an example embodiment, the semi-transparent layer includes a molybdenum-titanium alloy having a thickness of 50 Å to 100 Å. The transparent layer includes an indium-zinc-oxide having a thickness of 300 Å to 800 Å. The reflective layer includes a molybdenum-titanium alloy having a thickness of 1,000 Å to 2,000 Å.

In an example embodiment, the light emitting display device further comprises: a first transparent conductive layer disposed under the reflective layer; and a second transparent conductive layer disposed on the semi-transparent layer.

In an example embodiment, the first transparent conductive layer and the second transparent conductive layer include indium-zinc-oxide material having 100 Å to 200 Å.

In an example embodiment, in the trench, the bank is formed at a bottom surface of the trench. A dummy emission layer, which is a part of the emission layer, is disposed on the bank. The second electrode is disposed on the dummy emission layer.

In an example embodiment, the light emitting display device further comprises: a driving element layer on the substrate; a first planarization layer on the driving element layer; and second planarization layer on the first planarization layer. The first electrode is on the second planarization layer. The trench is formed by removing some of the second planarization layer.

In an example embodiment, the trench has a reverse-tapered shape in which a lower portion is wider than an upper portion.

In an example embodiment, the light emitting display device further comprises: a first color filter corresponding to the pixel and the trench; and a second color filter disposed at another pixel neighboring the pixel, and overlaps some of the first color filter. The first color filter and the second color filter overlap with each other at an area corresponding to the trench.

A light emitting display device according to some embodiments of the present disclosure may improve display quality by suppressing the reflection of external lights. In particular, the light emitting display device according to some embodiments of the present disclosure has a structure in which at least three conductive layers are sequentially stacked on an anode electrode. Therefore, the degradation of display quality due to reflection of external lights at the anode electrode may be minimized or prevented.

A light emitting display device according to some embodiments of the present disclosure may minimize or prevent degradation of display quality due to the leakage currents between pixels. In particular, the light emitting display device according to some embodiments of the present disclosure may minimize or prevent reflection of external lights in a trench area for preventing leakage currents between pixels.

As the result, it is possible to provide an ultra-high resolution light emitting display device that prevents image distortion due to leakage current and does not cause deterioration in image quality due to reflection of external lights.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 9 is a cross-sectional view along line III-III' shown in FIG. 8.

DETAILED DESCRIPTION OF THE DISCLOSURE

Figure 1:
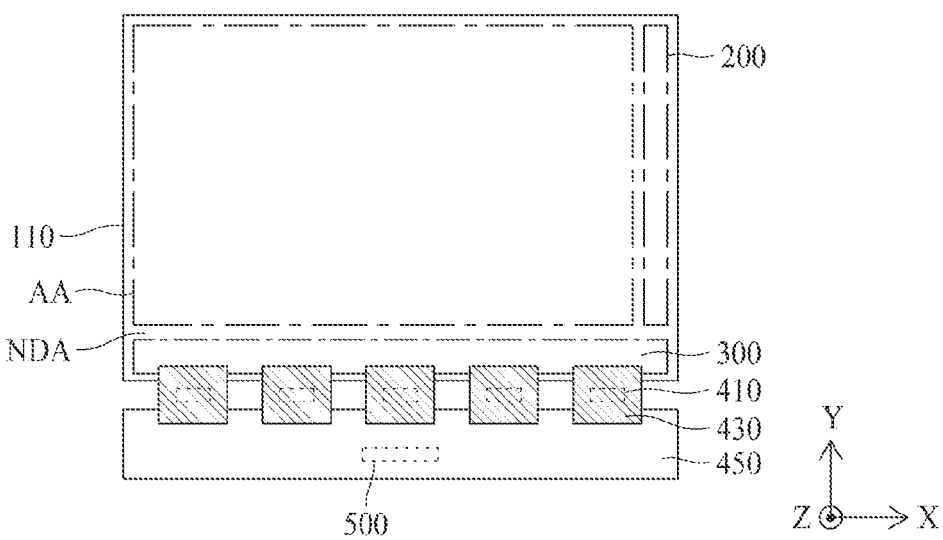
FIG. 1 is a plane view illustrating a schematic structure of a light emitting display device according to the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration may unnecessarily obscure an important point of the present disclosure, a detailed description of such known function of configuration may be omitted.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween. Also, if a first element is described as positioned "on" a second element, it does not necessarily mean that the first element is positioned above the second element in the figure. The upper part and the lower part of an object concerned may be changed depending on the orientation of the object. Consequently, where a first element is described as positioned "on" a second element, the first element may be positioned "below" the second element or "above" the second element in the figure or in an actual configuration, depending on the orientation of the object.

In describing a temporal relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing various elements in the present disclosure, terms such as first, second, A, B, (a), and (b) may be used. These terms are used merely to distinguish one element from another, and not to define a particular nature, order, sequence, or number of the elements. Where an element is described as being "linked", "coupled," or "connected" to another element, that element may be directly or indirectly connected to that other element unless otherwise specified. It is to be understood that additional element or elements may be "interposed" between the two elements that are described as "linked," "connected," or "coupled" to each other.

It should be understood that the term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an example of a display device according to the present disclosure will be described in detail with reference to the attached drawings. Wherever possible, the same reference numbers will be used throughout the drawings to refer to the same or like parts.

Hereinafter, referring to the attached figures, the present disclosure will be explained. Since a scale of each of elements shown in the accompanying drawings may be different from an actual scale for convenience of description, the present disclosure is not limited to the scale shown in the drawings.

FIG. 1 is a plane view illustrating a schematic structure of a light emitting display device according to an example of the present disclosure. In FIG. 1, X-axis refers to the direction parallel to the scan line, Y-axis refers to the direction of the data line, and Z-axis refers to the height direction of the display device.

Referring to FIG. 1, the light emitting display device comprises a substrate 110, a gate (or scan) driver 200, a data pad portion 300, a source driving IC (Integrated Circuit) 410, a flexible circuit film 430, a circuit board 450, and a timing controller 500.

The substrate 110 may include an electrical insulating material or a flexible material. The substrate 110 may be made of a glass, a metal or a plastic, but it is not limited thereto. When the light emitting display device is a flexible display device, the substrate 110 may be made of the flexible material such as plastic. For example, the substrate 110 may include a transparent polyimide material.

The substrate 110 may include a display area AA and a non-display area NDA. The display area AA, which is an area for representing the video images, may be defined as the majority middle area of the substrate 110, but it is not limited thereto. In the display area AA, a plurality of scan lines (or gate lines), a plurality of data lines and a plurality of pixels may be formed or disposed. Each of pixels may include a plurality of sub pixels. Each of sub pixels includes the scan line and the data line, respectively.

The non-display area NDA, which is an area not representing the video images, may be defined at the circumference areas of the substrate 110 surrounding all or some of the display area AA. In the non-display area NDA, the gate driver 200 and the data pad portion 300 may be formed or disposed.

The gate driver 200 may supply the scan (or gate) signals to the scan lines according to the gate control signal received from the timing controller 500 through the pad portion 300. The gate driver 200 may be formed at the non-display area NDA at any one outside of the display area DA on the substrate 110, as a GIP (Gate driver In Panel) type. GIP type means that the gate driver 200 is directly formed on the substrate 110. For example, the gate driver 200 may be configured with shift registers. In the GIP type, the transistors for shift registers of the gate driver 200 are directly formed on the upper surface of the substrate 110.

The pad portion 300 may be disposed in the non-display area NDA at one side edge of the display area AA of the substrate 110. The pad portion 300 may include data pads connected to each of the data lines, driving current pads connected to the driving current lines, a high-potential pad receiving a high potential voltage, and a low-potential pad receiving a low potential voltage.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible circuit film 430 as a COF (Chip On Film) or COP (Chip On Plastic) type.

The flexible circuit film 430 may include a plurality of first link lines connecting the pad portion 300 to the source driving IC 410, and a plurality of second link lines connecting the pad portion 300 to the circuit board 450. The flexible circuit film 430 may be attached on the pad portion 300 using an anisotropic conducting film, so that the pad portion 300 may be connected to the first link lines of the flexible circuit film 430.

The circuit board 450 may be attached to the flexible circuit film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 200 and a source control signal for controlling the source driving IC 410, based on the timing signal. The timing controller 500 may supply the gate control signal to the gate driver 200 and supply the source control signal to the source driving IC 410. Depending on the product types, the timing controller 500 may be formed as one chip with the source driving IC 410 and mounted on the substrate 110.

First Embodiment

Figure 2:
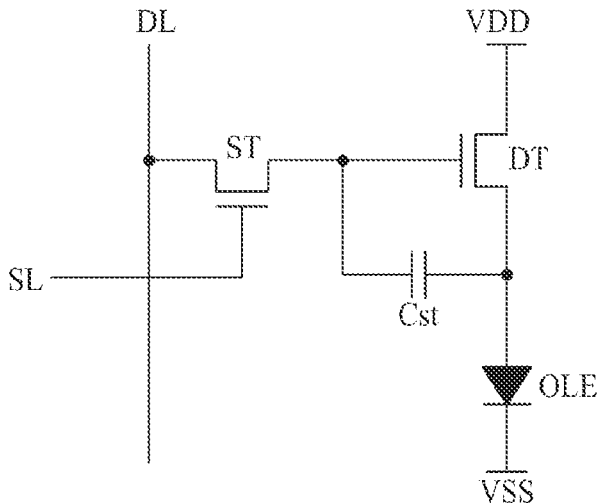
FIG. 2 is a circuit diagram illustrating a structure of one sub-pixel disposed in the display area shown in FIG. 1.
Figure 3:
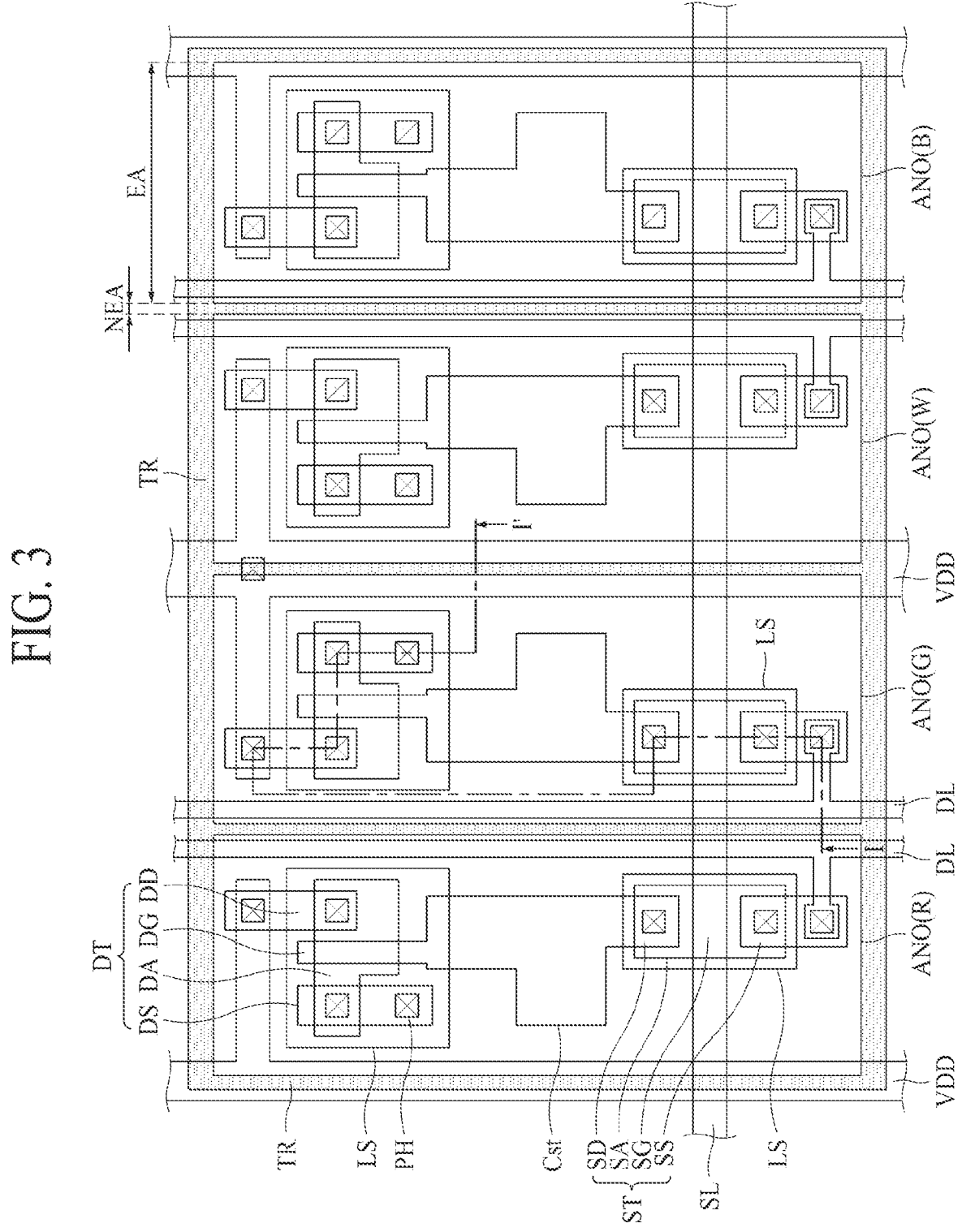
FIG. 3 is a plan view illustrating a structure of the sub-pixels disposed in the light emitting display device according to a first embodiment of the present disclosure.
Figure 4:
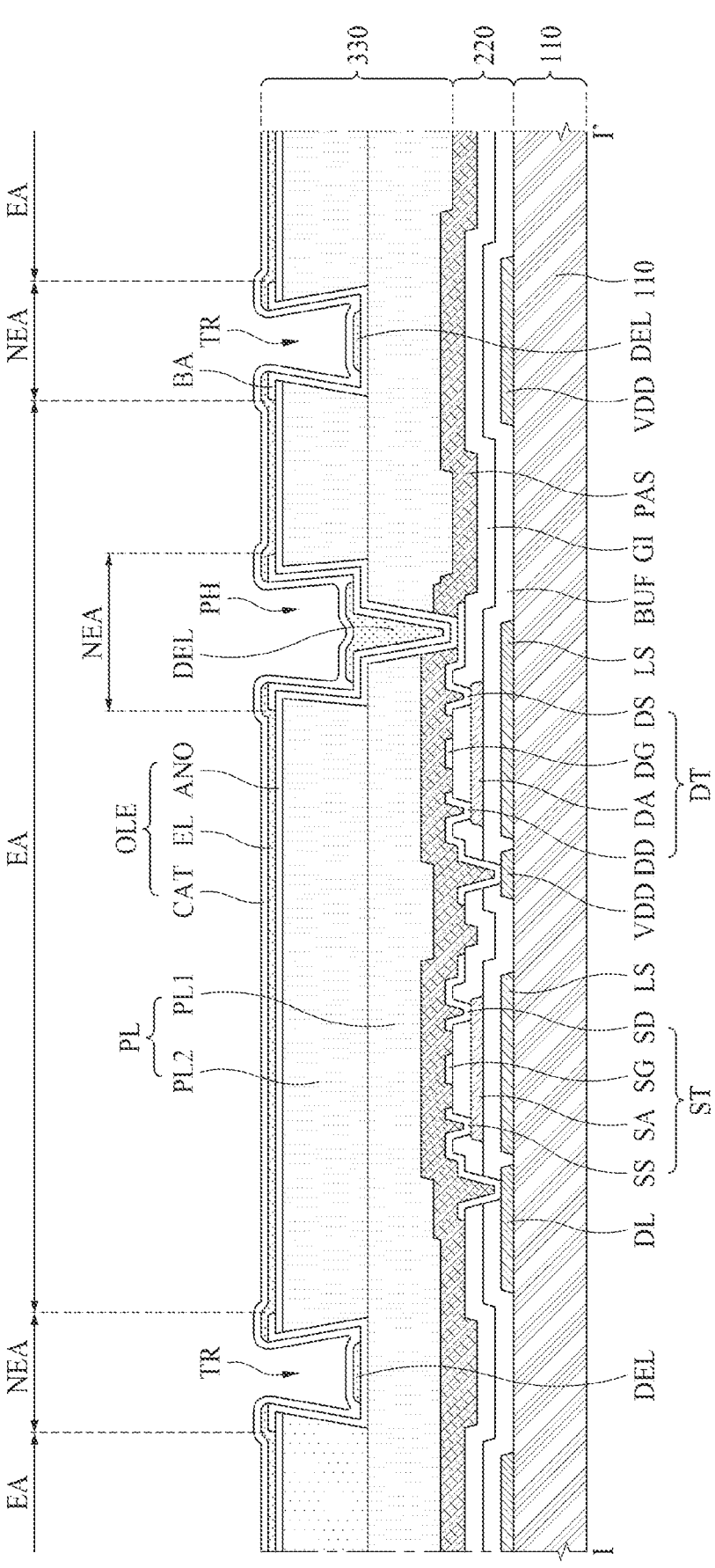
FIG. 4 is a cross-sectional view along to cutting line I-I' in FIG. 3.

Hereinafter, referring to FIGS. 2 to 4, a first embodiment of the present disclosure will be explained. FIG. 2 is a circuit diagram illustrating a structure of one sub-pixel disposed in the display area shown in FIG. 1. FIG. 3 is a plan view illustrating a structure of the sub-pixels disposed in the light emitting display device according to a first embodiment of the present disclosure. FIG. 4 is a cross-sectional view along to cutting line I-I' in FIG. 3.

Referring to FIGS. 2 to 4, each sub-pixel of the light emitting display device may be defined by a scan line SL, a data line DL and a driving current line VDD. Each pixel P of the light emitting display device may include a switching thin film transistor ST, a driving thin film transistor DT, a light emitting diode OLE and a storage capacitance Cst. The driving current line VDD may be supplied with a high-level voltage for driving the light emitting diode OLE.

A switching thin film transistor ST and a driving thin film transistor DT may be formed on a substrate 110. For example, the switching thin film transistor ST may be configured to be connected to the scan line SL and the data line DL which are crossing. The switching thin film transistor ST may include a gate electrode SG, a semiconductor layer SA, a source electrode SS and a drain electrode SD. The gate electrode SG may be connected to or branched from the scan line SL. The semiconductor layer SA may be disposed as crossing the gate electrode SG. The overlapped portion of the semiconductor layer SA with the gate electrode SG may be defined as the channel area. The source electrode SS may be connected to or branched from the data line DL, and the drain electrode SD may be connected to the driving thin film transistor DT. The source electrode SS may be one side of the semiconductor layer SA from the channel area, and the drain electrode SD may be the other side of the semiconductor layer SA. By supplying the data signal to the driving thin film transistor DT, the switching thin film transistor ST may play a role of selecting a pixel which would be driven.

The driving thin film transistor DT may play a role of driving the light diode OLE of the selected pixel by the switching thin film transistor ST. The driving thin film transistor DT may include a gate electrode DG, a semiconductor layer DA, a source electrode DS and a drain electrode DD. The gate electrode DG of the driving thin film transistor DT may be connected to the drain electrode SD of the switching thin film transistor ST. In the driving thin film transistor DT, the drain electrode DD may be connected to the driving current line VDD, further, the source electrode DS may be connected to the anode electrode (or pixel electrode) ANO of the light emitting diode (or light emitting element) OLE. The semiconductor layer DA may be disposed as crossing over the gate electrode DG. In the semiconductor layer DA, the overlapped portion with the gate electrode DG may be defined as a channel area. The source electrode DS may be connected at one side of the semiconductor layer DA around the channel area, and the drain electrode DD is connected to the other side of the semiconductor layer DA. A storage capacitance Cst may be disposed between the gate electrode DG of the driving thin film transistor DT and the anode electrode ANO of the light emitting diode OLE.

The light emitting diode OLE may generate light according to the current controlled by the driving thin film transistor DT. The driving thin film transistor DT may control the amount of current flowing from the driving current line VDD to the light emitting diode OLE according to the voltage difference between the gate electrode DG and the source electrode DS.

The light emitting diode OLE may include an anode electrode ANO, an emission layer EL, and a cathode electrode CAT. The light emitting diode OLE may emit lights according to the current controlled by the driving thin film transistor DT. In other words, the light emitting diode OLE may provide an image by emitting light according to the current controlled by the driving thin film transistor DT. The anode electrode ANO of the light emitting diode OLE may be connected to the source electrode DS of the driving thin film transistor DT. The cathode electrode CAT (or, common electrode) may be low-power line VS S supplied with the low-potential voltage. Therefore, the light emitting diode OLE may be driven by the electric current flown from the driving current line VDD to the low power line VS S controlled by the driving thin film transistor DT.

A plurality of pixels may be arrayed on the substrate 110. For example, along the horizontal direction, a red pixel, a green pixel, a white pixel and a blue pixel may be sequentially arrayed and disposed. The combination of the red pixel R, the green pixel G, the white pixel W and the blue pixel B may configure one pixel. In other case, the red pixel R, the green pixel G, the white pixel W and the blue pixel B may be called as sub-pixel. In this disclosure, the term of 'sub-pixel' may be the same meaning of the term of 'pixel'.

One pixel (or one sub-pixel) includes an anode electrode ANO. Each anode electrode ANO may be surrounded by trench TR. For example, an anode electrode ANO disposed in each pixel may have a rectangular shape and is surrounded by a trench TR. In detail, each pixel may be defined by the trench TR. Therefore, at least one trench TR may be disposed between red pixel R and green pixel G, between green pixel G and white pixel W, between white pixel W and blue pixel B, and between blue pixel B and red pixel R. In addition, at least one trench TR may be disposed at the upper side and the lower side of the red pixel R, the green pixel G, the white pixel W and the blue pixel B.

Referring to FIG. 4, a cross-sectional structure of the light emitting display device according to the first embodiment of the present disclosure will be explained. A light emitting display device according to the first embodiment may include a substrate 110, a driving element layer 220 and a light emitting element layer 330. The driving element layer 220 may include a plurality of thin layers formed on the substrate 110. The driving element layer 220 may include a switching thin film transistor ST and a driving thin film transistor DT.

On the substrate 110, a data line DL and a driving current line VDD may be formed. In addition to the data line DL and the driving current line VDD, a light shielding layer LS disposed to overlap the semiconductor layer SA and DA may be further included. The light shielding layer LS may be disposed in an island shape spaced apart from the data line DL and the driving current ling VDD by a predetermined distance and overlapping the semiconductor layers SA and DA.

A buffer layer BUF is deposited on entire surface of the substrate 110 as covering the data line DL and the driving current line VDD. The switching thin film transistor ST and the driving thin film transistor DT are formed on the buffer layer BUF.

In detail, on the buffer layer BUF, the semiconductor layer SA of the switching thin film transistor ST and the semi-conductor layer DA of the driving thin film transistor DT are formed. It is preferable that the channel areas in the semi-conductor layers SA and DA overlap with the light shielding layer LS.

A gate insulating layer GI is deposited on the substrate 110 as covering the semiconductor layers SA and DA. A gate electrode SG overlapping with the semiconductor layer SA of the switching thin film transistor ST and the gate electrode DG overlapping with the semiconductor layer DA of the driving thin film transistor DT are formed on the gate insulating layer GI. In addition, at both sides of the gate electrode SG of the switching thin film transistor ST, a source electrode SS contacting one side of the semiconduc-tor layer SA while being spaced apart from the gate electrode SG, and a drain electrode SD contacting the other side of the semiconductor layer SA are formed. Further, at both sides of the gate electrode DG of the driving thin film transistor DT, a source electrode DS contacting one side of the semicon-ductor layer DA while being spaced apart from the gate electrode DG, and a drain electrode DD contacting the other side of the semiconductor layer DA are formed.

The gate electrodes SG and DG, the source electrodes SS and DS, and the drain electrodes SD and DD are formed on the same layer, but are spatially and electrically separated from each other. The source electrode SS of the switching thin film transistor ST may be connected to the data line DL via a contact hole penetrating the gate insulating layer GI. Further, the drain electrode DD of the driving thin film transistor DT may be connected to the driving current line VDD via another contact hole penetrating the gate insulating layer.

A passivation layer PAS is deposited on the substrate 110 as covering the thin film transistors ST and DT. The passi-vation layer PAS may be made of an inorganic material such as silicon oxide or silicon nitride.

The light emitting element layer 330 is formed on the driving element layer 220. The light emitting element layer 330 may include a light emitting diode OLE. Before forming the light emitting diode OLE, a first planarization layer PL1 may be deposited on the passivation layer PAS. The surface of the substrate 110 on which the thin film transistors ST and DT are formed is not uniform or even, so the first planar-ization layer PL1 is a thin film for flattening the uneven surface condition. To make the height difference being even, the first planarization layer PL1 may be formed of an organic material. A pixel contact hole PH exposing a part of the source electrode DS of the driving thin film transistor DT is formed in the passivation layer PAS and the first planariza-tion layer PL1.

A second planarization layer PL2 is deposited on the top surface of the first planarization layer PL1. The second planarization layer PL2 may have a trench TR and an aperture area for exposing the pixel contact hole PH. The trench TR defines a pixel area and is preferably formed to surround the pixel. The aperture is preferably formed to have a larger size than the pixel contact hole PH so as to completely expose the pixel contact hole PH formed in the first planarization layer PL1. Here, for convenience, the pixel contact hole PH and the aperture are combined and named as the pixel contact hole PH.

It is preferable that the trench TR and the pixel contact hole PH formed at the second planarization layer PL2 has a reverse-tapered shape in the cross-sectional view. To do so, the second planarization layer PL2 is preferably formed of a negative organic material. For example, the second pla-narization layer PL2 may be formed of a negative photo-resist material. The negative photo-resist materials, by their nature, tend to easily form reverse-tapered shapes in expo-sure and development processes. The reason for making the reverse-tapered shape is to disconnect the organic film applied to the trench TR from the wall structure of the trench TR.

The anode electrode ANO is formed on the top surface of the second planarization layer PL2. The anode electrode ANO connects to the source electrode DS of the driving thin film transistor DT via the pixel contact hole PH. The anode electrode ANO may have different structure and configuring elements according to the emission type of the light emitting diode OLE. For example, in the case of a bottom emission type that provides lights in the direction of the substrate 110, it may be formed of a transparent conductive material. For another example, in the case of a top emission type that provides lights in the upward direction facing the substrate 110, it may be formed of a metal material having excellent light reflectance. Since the present disclosure relates to the top emission type display device, the anode electrode ANO preferably includes a metal material.

The anode electrode ANO is connected to the drain electrode DD of the driving thin film transistor DT via the pixel contact hole PH. In detail, the anode electrode ANO is formed as to be stacked on the etched side surface of the second planarization layer PL2, the top surface of the first planarization layer PL1, and the etched side surface of the first planarization layer PL1 in the pixel contact hole PH, and then connected to the drain electrode DD.

Further, the anode electrode ANO is deposited only within the pixel area by the trench TR. That is, the pixel area may be defined by the trench TR, and the anode electrode ANO may be formed as having the same size as that of the pixel area by the trench TR. Therefore, it is preferable that the portions of the anode electrode ANO are remained at the bottom surface of the trench TR using an etching process. In some cases, the anode electrode ANO may be stacked on the etched side wall, i.e. the slanted side wall, of the trench TR.

In this case, the portions of the anode electrode ANO remained on the bottom surface of the trench TR is preferably removed.

A bank BA is formed on the top surface of the substrate 110 having the anode electrode ANO. It is preferable that the bank BA is made of an inorganic insulating material such as silicon oxide or silicon nitride. The bank BA covers the edge portions of the anode electrode ANO where the trench TR is formed, and has a stacked structure along the etched side wall and bottom surface of the trench TR. The bank BA covers edge portions of the anode electrode ANO defined by the trench TR. Therefore, the bank BA prevents the edge portions of the anode electrode ANO from being electrically shorted with the cathode electrode CAT deposited later.

In addition, the bank BA may be disposed on portions of the anode electrode ANO stacked on the pixel contact hole PH. As a result, the area not covered by the bank BA is defined as the emission area EA, and the area where the bank BA is formed is defined as the non-emission area NEA.

An emission layer EL is disposed on the anode electrode ANO and bank BA. The emission layer EL may be deposited on entire of the display area AA of the substrate 110 as covering the anode electrode ANO and the bank BA. On the upper surface of the second planarization layer PL2, the emission layer EL is deposited on the upper surface of the bank BA covering the edge of the anode electrode ANO, and is deposited on the emission area EA of the anode electrode ANO exposed by the bank BA. Further, inside the trench TR, the emission layer EL may be deposited in an island shape on the upper surface of the bank BA disposed on the bottom surface of the trench TR. A part of the emission layer stacked in an island shape on the bottom surface of the trench TR is separated from the emission layer EL deposited in the emission area EA, and does not perform the emission function, so it is called a dummy emission layer DEL. In the pixel contact hole PH, the emission layer EL may be deposited in the same manner as in the trench TR.

On the other hand, the emission layer EL may be not deposited on the sidewall of the trench TR. As the result, the emission layer EL may be deposited while being separated from adjacent pixel areas by the trench TR. When the emission layer EL has a structure connected to neighboring pixels on the surface of the substrate 110, leakage current may flow in a horizontal direction along the emission layer EL. Due to the leakage current, image signals supplied to pixels may be distorted. However, for the light emitting display device according to the first embodiment of the present disclosure, the emission layer EL has a structure in which each pixel is separated by the trench TR. Accordingly, a lateral leakage current does not occur.

For an embodiment, the emission layer EL may include at least two emission parts for generating white light. For example, the emission layer EL may include a first emission part and a second emission part vertically stacked for generating white light by mixing the first light from the first emission part and the second light from the second emission part.

For another example, the emission layer EL may include any one of a blue emission part, a green emission part, and a red emission part for generating light corresponding to a color set in each pixel. Further, the light emitting diode OLE may include a functional layer for improving light emitting efficiency and/or lifetime of the emission layer EL.

A cathode electrode CAT is deposited on the entire surface of the substrate 110 on which the emission layer is formed. The cathode electrode CAT is deposited to make surface contact with the emission layer EL. The cathode electrode CAT is formed over the entire substrate 110 to be commonly connected to the emission layer EL deposited in all pixels. In the case of the top emission type, the cathode electrode CAT may include a transparent conductive material. For example, the cathode electrode CAT may be made of a transparent conductive material such as indium-tin-oxide (ITO) or indium-zinc-oxide (IZO).

The light emitting display device according to the present disclosure may be configured to include a low-reflection structure or an anti-reflection structure for minimizing or suppressing the reflection of external light by using metal elements disposed on the substrate 110. The light emitting display device according to the present disclosure may have a top emission type. Accordingly, the user may look at the light emitting display device from the upper direction of the substrate 110. At this time, when external light is reflected, the user cannot properly recognize image information.

In the top emission type display device, the main factor of reflecting external light is the anode electrode ANO made of a metal material that reflects light while occupying the largest area on the surface of the substrate 110. Since the trench TR is disposed between the anode electrodes ANO and the trench TR is covered by the bank BA, when the bank BA is formed of a black material, the reflection of external lights at the bank BA may be minimized. However, the anode electrode ANO may be made of a metal material such as silver (Ag) or molybdenum-titanium (MoTi) having excellent light reflectance. Therefore, a structure for reducing external light reflectance at the anode electrode ANO may be required.

Figure 5:
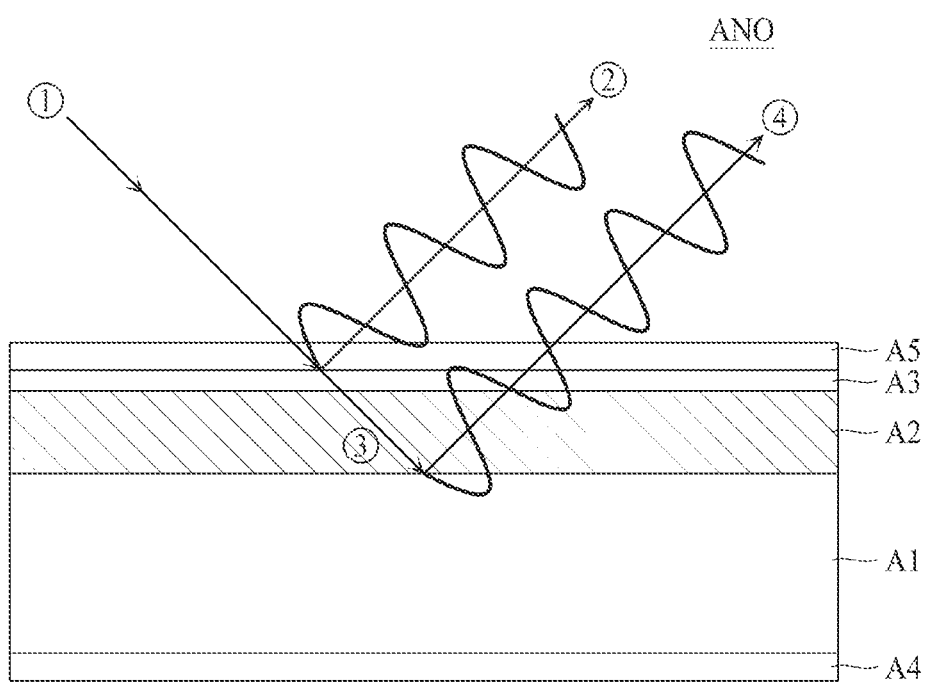
FIG. 5 is a diagram illustrating a reflection reduction mechanism in the anode electrode shown in FIG. 3 or FIG. 4.

Hereinafter, referring to FIG. 5, the structure of an anode electrode ANO for suppressing the external light reflectance in a light emitting display device according to a first embodiment of the present disclosure will be explained. FIG. 5 is a diagram illustrating a reflection reduction mechanism in the anode electrode shown in FIG. 3 or FIG. 4.

An anode electrode ANO of a light emitting display device according to the first embodiment of the present disclosure may have a structure in which at least three metal layers are sequentially stacked. For example, the anode electrode ANO may include a reflection layer A1, a transparent layer A2 and a semi-transparent layer A3 (or transflective layer). The reflection layer A1 is preferably made of a material suitable for reflecting all light emitted from the emission layer EL toward the upper side of the substrate 110. Here, the reflection layer A1 preferably has a thickness capable of reflecting light generated from the emission layer EL without transmitting it. For an example, the reflection layer A1 may include metal layer made of molybdenum-titanium (MoTi) or silver (Ag) and having a thickness in a range of 1,000 Å to 2,000 Å.

The transparent layer A2 is preferably made of a transparent conductive material. For example, the transparent layer A2 may include indium-zinc-oxide (IZO). The transparent layer A2 may have a thickness in a range of 300 Å to 800 Å. Here, the thickness of the transparent layer A2 preferably has a thickness that can satisfy the condition that the phase of the first reflected light from the upper surface of the transparent layer A2 and the phase of the second reflected light from the lower surface of the transparent layer A2 may be opposite to each other.

The semi-transparent layer A3 may be a thin layer that adjusts reflectance and transmittance to be 50% each other so that incident external light is partially reflected from the upper surface and the rest is transmitted through the semi-transparent layer A3 itself. For example, the semi-transparent layer A3 may include molybdenum-titanium (MoTi) or silver (Ag) having a thickness in a range of 50 Å to 100 Å.

The anode electrode ANO needs to have appropriate work function energy for driving the light emitting diode OLE. For example, when the anode electrode ANO is made of only a metal material, the work function may not be satisfied. In this case, in order to match the work function, materials, such as indium-tin-oxide or indium-zinc-oxide, which have higher resistance than metal materials may be included.

The anode electrode ANO according the first embodiment of the present disclosure includes a transparent layer A2 made of IZO between the semi-transparent layer A3 made of a metal material and the reflective layer A1. In this case, the anode electrode ANO may include five anode electrode layers. That is, since the transparent layer A2 is included, the work function may be satisfied to some extent. However, the transparent layer A2 is not a layer for adjusting the work function and adjusts the phase of the reflected light, so it may not be possible to adjust the work function only with the transparent layer A2.

In this case, a first transparent conductive layer A4 may be further provided under the reflective layer A1. In addition, a second transparent layer A5 may be further provided on the semi-transparent layer A3. For example, the first transparent conductive layer A4 and the second transparent conductive layer A5 may be formed of indium-tin-oxide having a thickness in a range of 100 Å to 200 Å.

The semi-transparent layer A3, when it is made of aluminum, is preferably formed to a thickness in a range of 100 Å to 200 Å. Metallic materials such as aluminum are opaque and have very high reflectivity. However, when aluminum layer is formed very thin, it may transmit light. For example, with a thin thickness of 200 Å or less, a part (40% to 50%) of incident light is reflected by the thin aluminum layer, and the rest (50% to 60%) may be transmitted through the thin aluminum layer.

The anode electrode ANO having such a thickness and stacked structure may minimize the reflectance of external light incident into the semi-transparent layer A3 from outside. Hereinafter, a mechanism for reducing reflection of external light at the anode electrode ANO will be described with reference to arrows indicating light paths shown in FIG. 5. FIG. 5 shows an anode electrode ANO having a five-layer structure including a first transparent conductive layer A4 and a second transparent conductive layer A5. Since the first transparent conductive layer A4 and the second transparent conductive layer A5 simply transmit light, so they do not play an important role of reducing the light reflection. Thus, the light paths for reducing the reflectance according to the stacked structure of the semi-transparent layer A3, the transparent layer A2 and the reflective layer A1 are mainly described.

The incident light ① from the upper side of the anode electrode ANO may pass through the second transparent conductive layer A5 and then reach to the upper surface of the semi-transparent layer A3. Some of the incident light ① may be reflected at the upper surface of the semi-transparent layer A3 and then proceed toward the opposite side of the substrate 110 as the first reflected light ②. Since the semi-transparent layer A3 has a thin thickness of 100 Å or less, all of the incident light ① may not be reflected. For example, 50% of the incident light ① may be reflected as the first reflected light ②, and the remaining 50% of the incident light ① may pass through the semi-transparent layer A3.

The whole amount of the transmitted light ③ passing through the semi-transparent layer A3 may pass through the transparent layer A2. Here, a little amount of the transmitted light ③ may be reflected at the interface of the semi-transparent layer A3 and the transparent layer A2. This is because the refractive index of the semi-transparent layer A3 and the refractive index of the transparent layer A2 are different from each other. However, since the reflected light at the interface between the semi-transparent layer A3 and the transparent layer A2 has a small amount of light, it is not considered here.

After that, the transmitted light ③ may be reflected by the reflective layer A1. Since the reflective layer A1 may have a thickness of 1,000 Å to 2,000 Å, the whole amount of the transmitted light ③ may be reflected and proceed toward the opposite direction of the substrate 110 as the second reflected light ④.

Here, by adjusting or changing the thickness of the transparent layer A2, the phases of the first reflected light ② and the second reflected light ④ may be set to cancel each other. As a result, the luminance of reflected light, which is the intensity of reflected light incident from the upper outside of the anode electrode ANO and reflected, may be reduced to a level of 2%.

Meanwhile, among the light emitted from the emission layer EL, the amount of light emitted to the direction of the anode electrode ANO and reflected by the anode electrode ANO may be reduced to a level of 2% through the same mechanism. However, since the light emitted from the emission layer EL may be propagated in all directions, the amount of light reduced by the anode electrode ANO may be only about 50% of the total amount of the light from the emission layer EL, and the remaining 50% may be emitted toward the outer upper side of the substrate 110.

In the light emitting display device according to the first embodiment, the reflectance of external light may be suppressed as much as possible by the structure of the triple layered anode electrode ANO. Accordingly, there is no need to disposes a polarizing element outside the substrate 110 to reduce reflection of external light. The polarization element has a positive effect of suppressing the external light reflection, but has a negative effect of reducing the amount of light emitted from the emission layer EL by at least 50%.

In the light emitting display device according to the first embodiment, the amount of the light emitted from the emission layer EL may be reduced by about 50% due to the anode electrode ANO of the triple layer stack structure, but this is almost the same as the reduction in the amount of light due to the polarization element. Accordingly, the light emitting display device according to the present disclosure may reduce the external light reflection while providing the same level of luminous efficiency without using an expensive polarization element.

Hereinafter, referring to FIGS. 6A to 6H, a manufacturing process of the light emitting display device according to the first embodiment will be explained. FIGS. 6A to 6H are cross-sectional views illustrating a manufacturing process for light emitting display device according the first embodiment of the present disclosure.

Figure 6A:
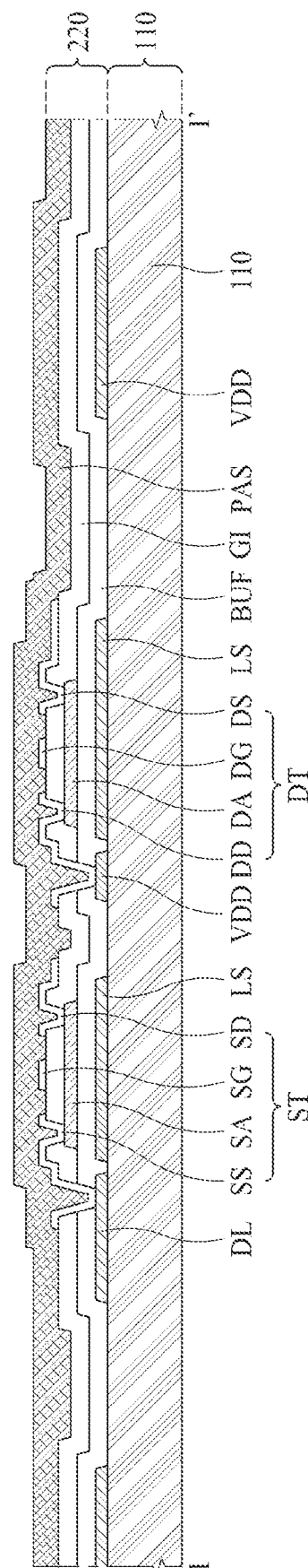
FIGS. 6A to 6H are cross-sectional views illustrating a manufacturing process for light emitting display device according to the first embodiment of the present disclosure.

Referring to FIG. 6A, a driving element layer 220 is formed on a substrate 110. A data line DL and a driving current line VDD are formed on the substrate 110. Further, a light shielding layer LS may be formed where the semiconductor layer will be disposed.

A buffer layer BUF may be deposited on entire surface of the substrate 110 over the data line DL and the driving current line VDD. A switching thin film transistor ST and a driving thin film transistor DT are formed on the buffer layer BUF. At first, a semiconductor layer SA of the switching thin film transistor ST and a semiconductor layer DA of the driving thin film transistor DT are formed on the buffer layer.

A gate insulating layer GI is deposited over the semiconductor layers SA and DA as covering entire top surface of the substrate 110. By patterning the gate insulating layer GI, contact holes for exposing both sides of each semiconductor layers SA and DA are formed. At the same time, by patterning the gate insulating layer GI and the buffer layer BUF, contact holes for exposing some portions of the data line DL and the driving current line VDD are formed.

A gate electrode SG, a source electrode SS and a drain electrode SD of the switching thin film transistor ST, and a gate electrode DG, a source electrode DS and a drain electrode DD of the driving thin film transistor DT are formed on the gate insulating layer GI. The source electrode SS of the switching thin film transistor ST may be connected to the data line DL, and the source electrode DS of the driving thin film transistor DT may be connected to the driving current line VDD. The gate electrode SG of the switching thin film transistor ST may be disposed as overlapping the semiconductor layer SA of the switching thin film transistor ST. Further, the gate electrode DG of the driving thin film transistor DT may be disposed as overlapping the semiconductor layer DA of the driving thin film transistor DT.

A passivation layer PAS is deposited over the upper surface of the substrate 110 on which the thin film transistors ST and DT are formed. Thus, the driving element layer 220 is completed.

Figure 6B:
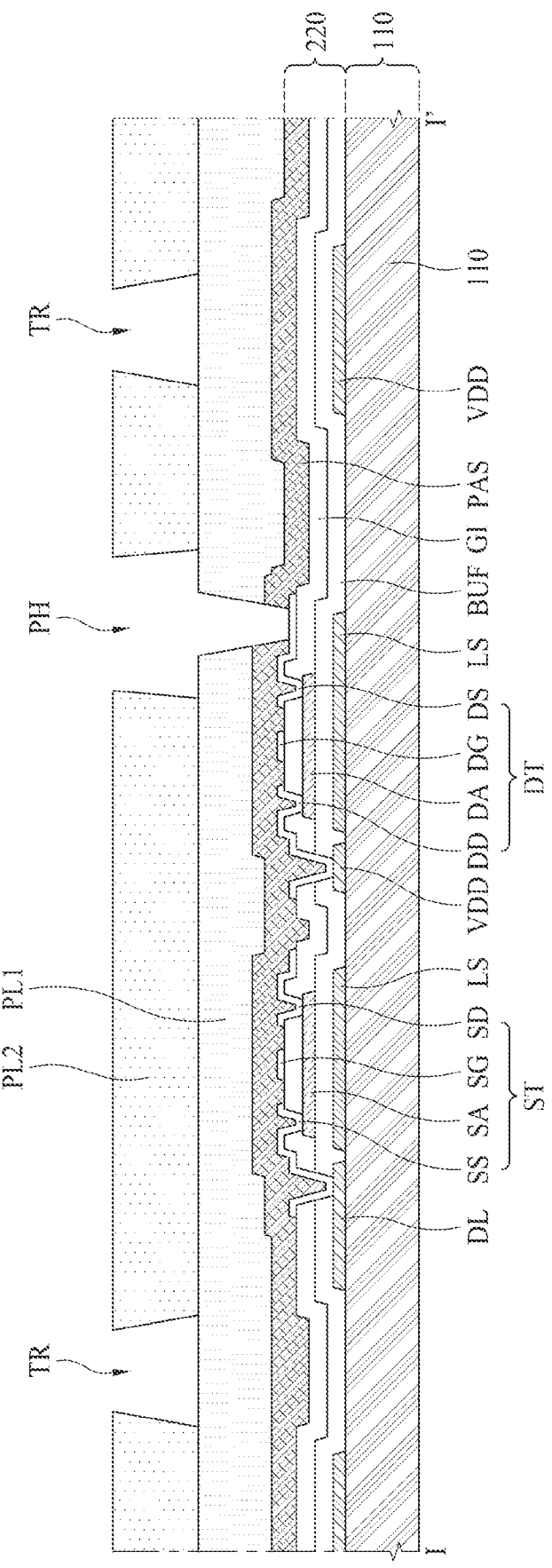
Figure 6C:
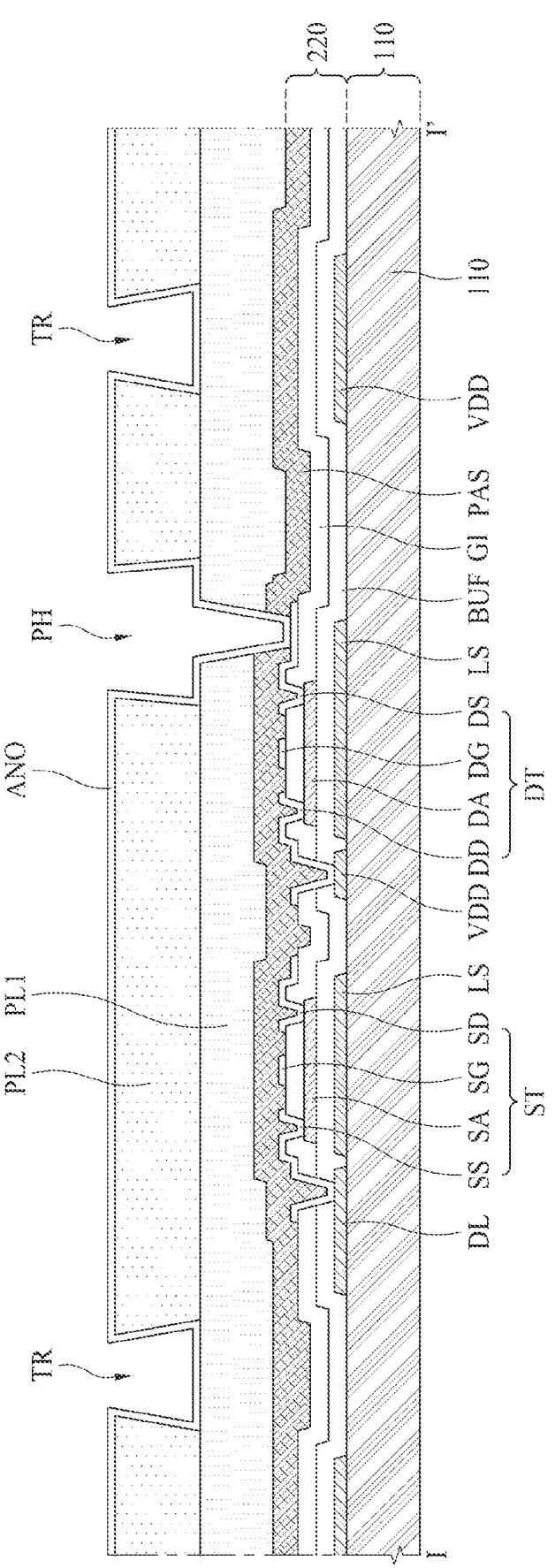

Referring to FIG. 6B, a first planarization layer PL1 is deposited on the passivation layer PAS of the driving element layer 220. By patterning the first planarization layer PL1 and the passivation layer PAS, a pixel contact hole PH is formed to expose some of the drain electrode DD of the driving thin film transistor DT. A second planarization layer PL2 is deposited on the first planarization layer PL1. A trench TR is formed by patterning the second planarization layer PL2. The trench TR may be formed as defining the pixel area. At the same time, an aperture for exposing the pixel contact hole PH formed at the first planarization layer PL1 is formed to complete the pixel contact hole PH. Using a negative photo-resist material for the second planarization layer PL2, the cross-sectional shapes of the trench TR and the pixel contact hole PH may have a reverse-tapered shapes in which the upper portion is narrower than the lower portion.

Referring to 6C, a material for the anode electrode ANO is deposited on the second planarization layer PL2 having the trench TR and the pixel contact hole PH. For example, as shown in FIG. 5, the anode electrode ANO may include a first transparent conductive layer A4, a reflective layer A1, a transparent layer A2, a semi-transparent layer A3 and a second transparent conductive layer A5 sequentially stacked. Here, the material for the anode electrode ANO may be deposited on the upper surface of the second planarization layer PL2, the side wall of the trench TR and the bottom surface of the trench TR continuously.

Figure 6D:
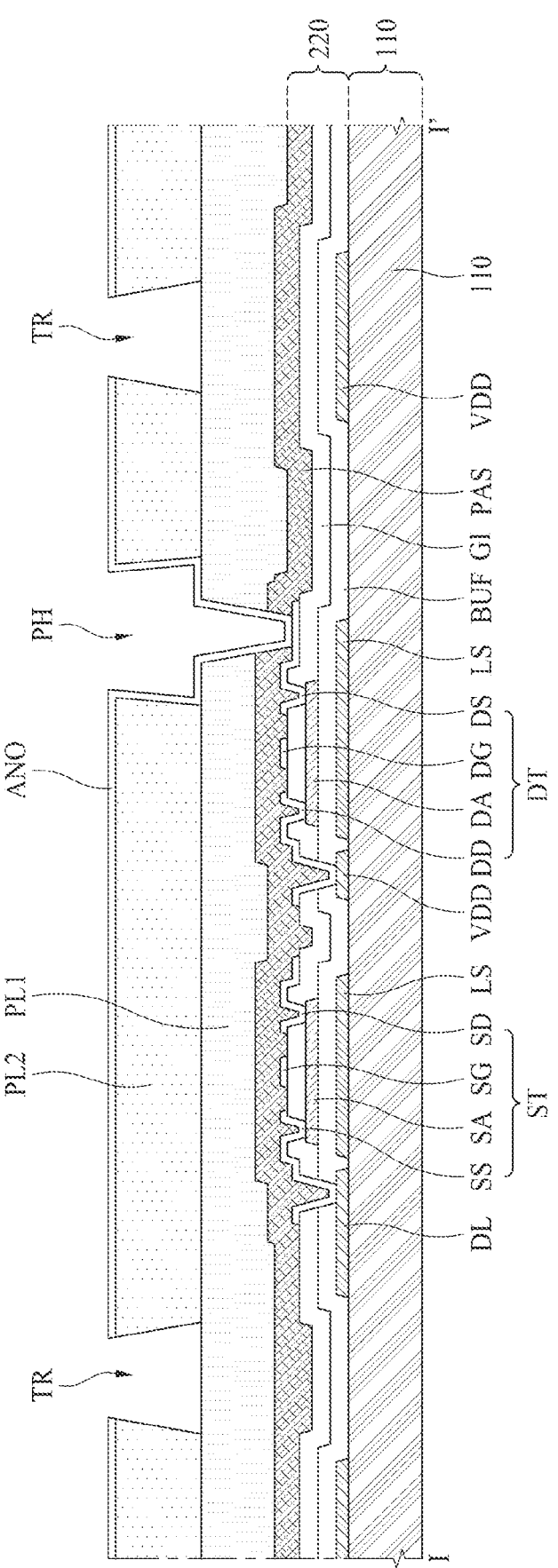

Referring to FIG. 6D, some of the anode electrode ANO material filled in the trench TR is selectively removed. Here, the anode electrode ANO material filled in the pixel contact hole PH is remained. By removing the anode electrode ANO material deposited on the bottom surface of the trench TR, the pixel is defined. Here, the anode electrode ANO material on the side wall of the trench TR is preferably removed. That is, the anode electrode ANO is formed as that the edge of the anode electrode ANO is formed to coincide with an upper end of the sidewall of the trench TR. In the pixel, the anode electrode ANO is completed as being formed on the upper surface of the second planarization layer PL2 and connected to the drain electrode DD of the driving thin film transistor DT through the pixel contact hole PH. Accordingly, the anode electrode ANO is defined by the trench TR, and two neighboring anode electrodes ANO are spaced apart by the trench TR.

Figure 6E:
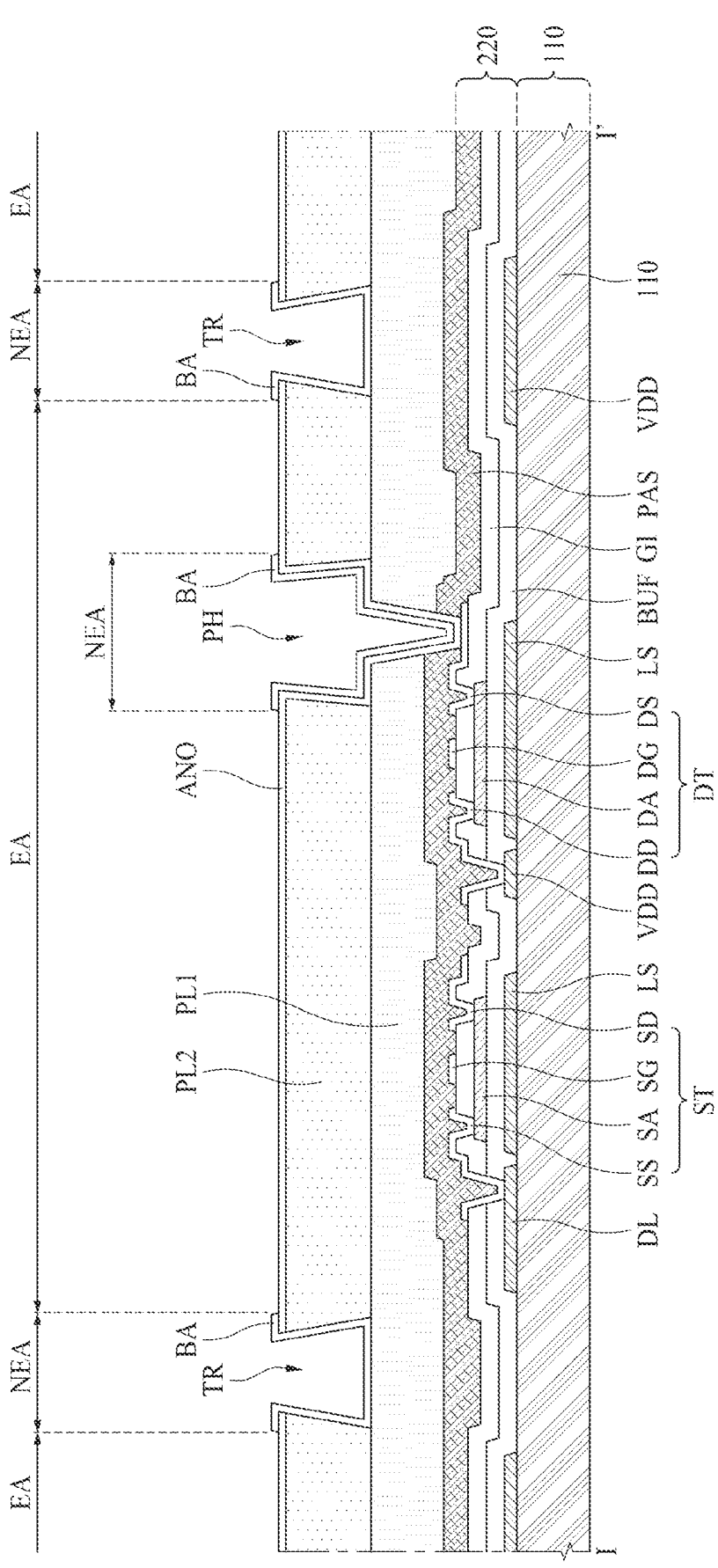

Referring to FIG. 6E, a bank BA is formed on the trench TR and the pixel contact hole PH. Here, the bank BA may be made of an inorganic material. In this case, the bank BA is formed to cover a portion of circumference of the anode electrode ANO formed on the upper surface of the second planarization layer PL2 in the trench TR, and to cover the side wall and the bottom surface of the trench TR. At the pixel contact hole PH, the bank BA is formed to cover a part of the top surface of the second planarization layer PL2 and the side wall and the bottom surface of the pixel contact hole PH. An emission area EA and a non-emission area NEA are defined by the bank BA. That is, the area where the bank BA is formed becomes the non-emission area NEA, and the area where the bank BA is not formed becomes the emission area EA.

Figure 6F:
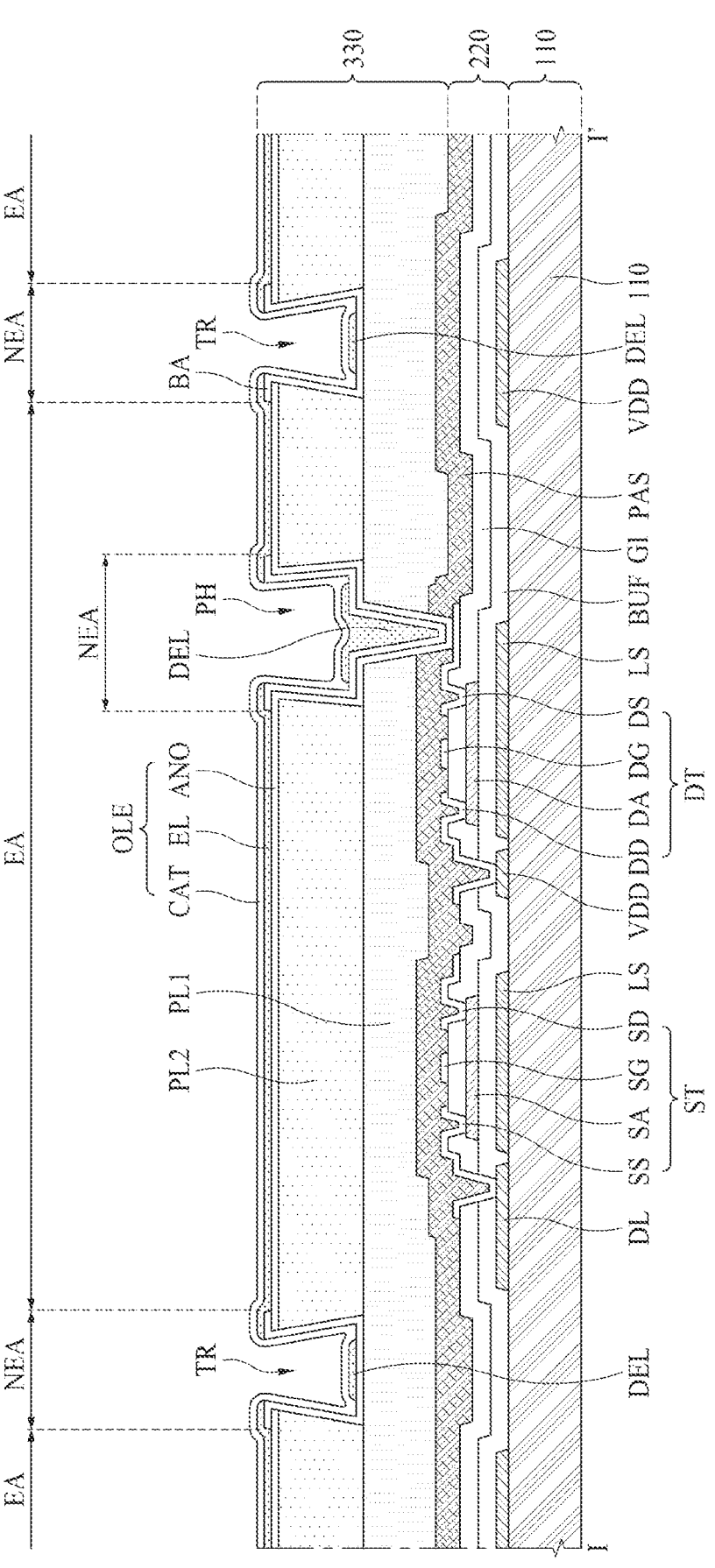

Referring to FIG. 6F, an emission layer EL is deposited on the top surface of the substrate 110 having the bank BA. As the emission layer EL includes an organic material, the emission layer EL is not deposited to the side wall of the reverse-tapered trench TR and the pixel contact hole PH, the lower width of which is wider than the upper width. That is, the emission layer EL is deposited on the top surface of the second planarization layer PL2 and is not deposited to the side wall of the trench TR and the pixel contact hole PH. Meanwhile, the emission layer EL may be deposited on the bottom surfaces of the trench TR and the pixel contact hole PH. However, the emission layer EL deposited on the bottom surfaces of the trench TR and the pixel contact hole PH is not connected to the emission layer EL which is in surface contact with the anode electrode ANO on the top surface of the second planarization layer PL2. Therefore, it is named as a dummy emission layer DEL.

A cathode electrode CAT is deposited on entire top surface of the substrate 110 having the emission layer EL. Accordingly, the light emitting element layer 330 is formed on the driving element layer 220. The structure up to now is the same as that in FIG. 4. After that, an encapsulation layer is further formed to complete the light emitting display device.

Figure 6G:
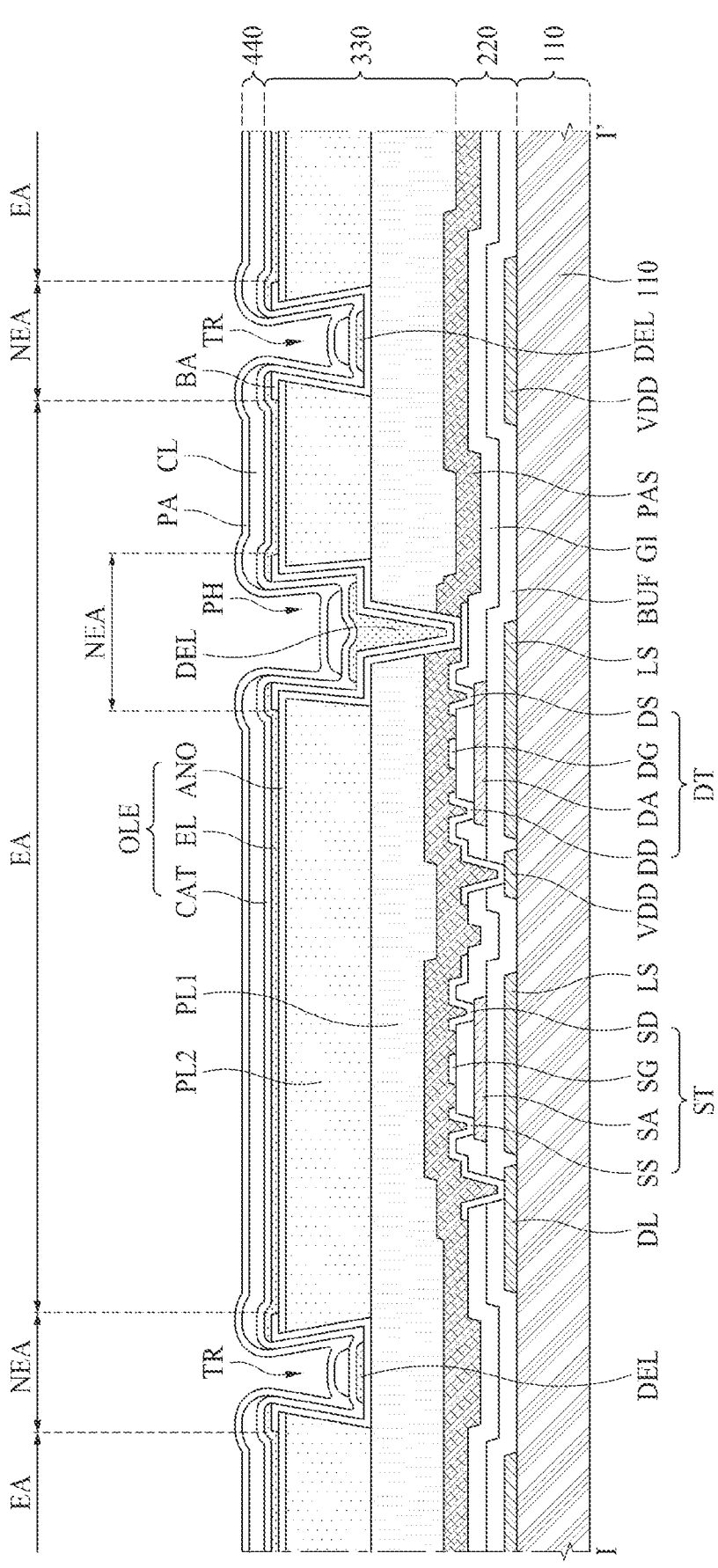

Referring to FIG. 6G, a capping layer CL is deposited on the cathode electrode CAT of the light emitting element layer 330. The capping layer CL may include an organic material. Using the organic material, the capping layer CL may have the same stack structure as the emission layer EL. For example, the capping layer CL may be deposited on the top surface of the second planarization layer PL2, a bottom surface of the trench TR, and the bottom surface of the pixel contact hole PH. Meanwhile, the capping layer CL is not deposited on the side surfaces of the trench TR and the pixel contact hole PH. An inorganic layer PA is deposited on the capping layer CL. The inorganic layer PA may include silicon oxide or silicon nitride. Accordingly, an encapsulation layer 440 including the capping layer CL and the organic layer PA are formed.

Figure 6H:
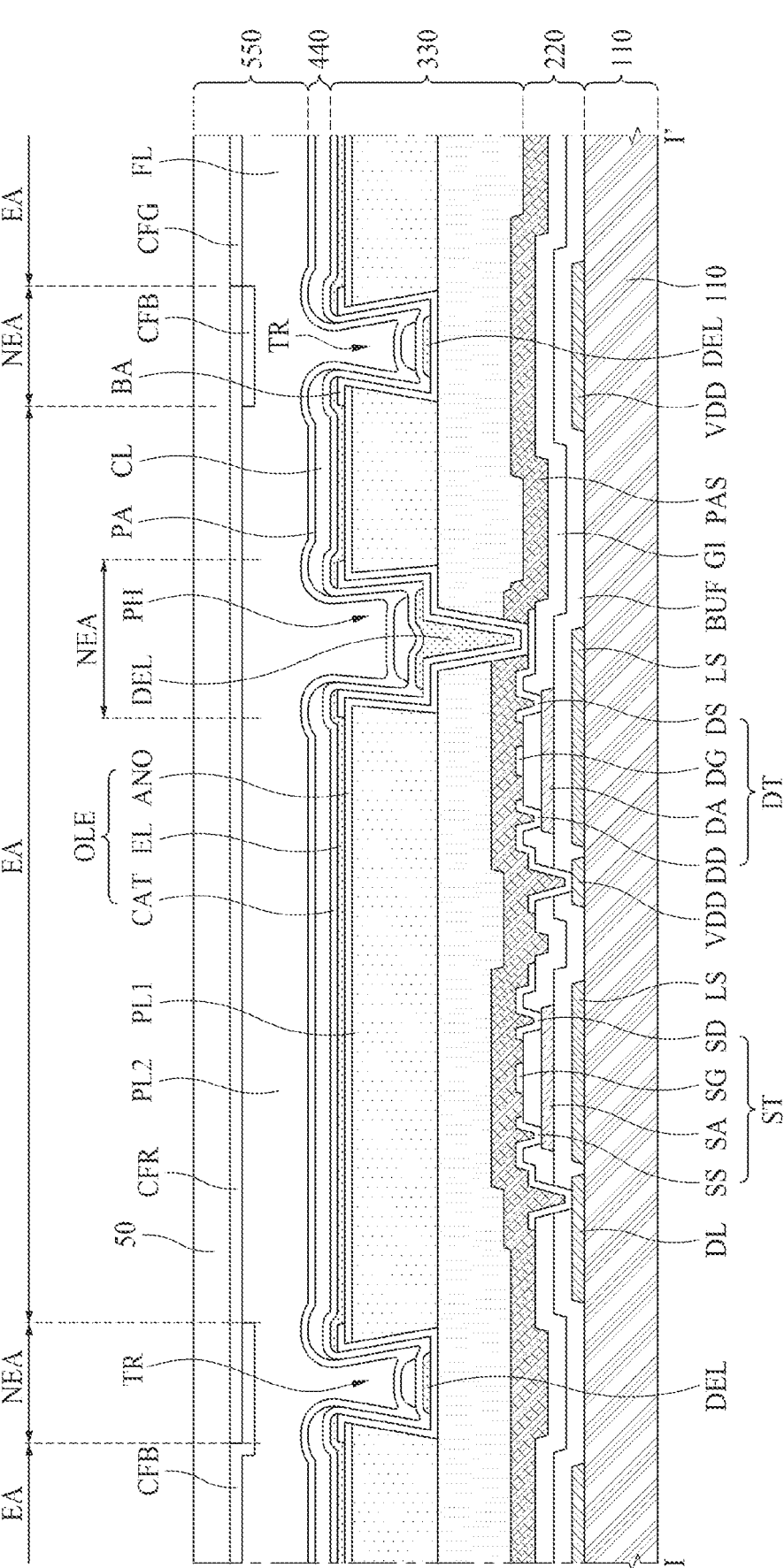

Referring to FIG. 6H, a color filter plate 550 is attached on the top surface of the substrate 110 having the encapsulation layer 440. The color filter plate 550 may include an upper substrate 50, color filters CFR, CFG and CFB, and filling layer FL. The color filters CFR, CFG and CFB are formed on the inner surface of the upper substrate 50. For example, the red color filter CFR may be disposed as corresponding to the red pixel R. The green color filter CFG may be disposed as corresponding to the green pixel G. The blue color filter CFB may be disposed as corresponding to the blue pixel B. In addition, two color filters are stacked at positions corresponding to the trench TR.

For example, a red color filter CFR and a blue color filter CFB may be stacked at positions corresponding to the trench TR disposed between the blue pixel B and the red pixel R. The red color filter CFR and the blue color filter CFB may be stacked at positions corresponding to the trench TR disposed between the red pixel R and the green pixel G. When the red color filter CFR and the blue color filter CFB are stacked, substantially all light may be not transmitted. Accordingly, the blue color filter CFB and the red color filter CFR may be stacked in an area corresponding to the trench TR to become an area in which light is not transmitted or reflected.

The filling layer FL is deposited on the color filters CFR, CFG and CFB. The color filter plate 550 is attached to the encapsulation layer 440 with the filling layer FL interposed therebetween.

Figure 7:
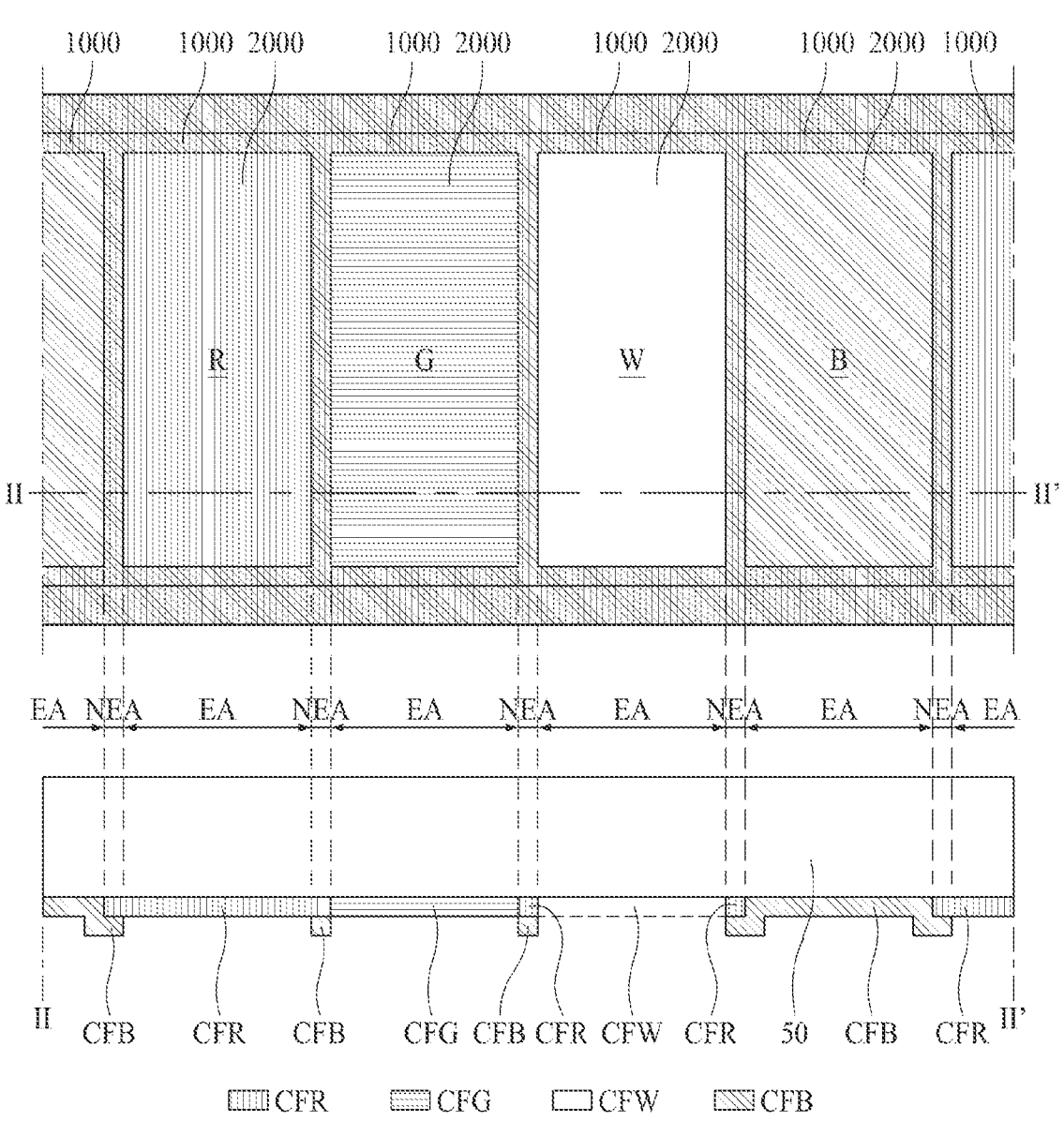
FIG. 7 is a plane view and a cross-sectional view illustrating a structure of color filters in the light emitting display device according the first embodiment of the present disclosure.

Hereinafter, referring to FIG. 7, a detailed structure of the color filter plate in the light emitting display device according to the first embodiment will be explained. FIG. 7 is a plane view and a cross-sectional view illustrating a structure of color filters in the light emitting display device according the first embodiment of the present disclosure. A cross-sectional view is shown below in FIG. 7 as cutting along the line II-II' in the plane view shown above in FIG. 7.

Referring to FIG. 7, the color filters are disposed on the inner side of the upper substrate 50. Here, the color filter includes a red color filter CFR, a green color filter CFG, a white color filter CFW and a blue color filter CFB.

According to the planar structure of the upper substrate 50, a plurality of pixel areas 2000 are disposed on the upper substrate 50. A trench area 1000 is disposed between each pixel areas 2000. The pixel area 2000 may correspond to the anode electrode ANO disposed in the pixel defined on the substrate 110.

The red color filter CFR may be disposed at pixel areas 2000 corresponding to the red pixels R defined in the substrate 110, and all trench areas 1000. The green color filter CFG may be disposed at pixel areas 2000 corresponding to the green pixels G defined in the substrate 110. The white color filter CFW may be disposed at pixel areas 2000 corresponding to the white pixels W defined in the substrate 110. The blue color filter CFB may be disposed at pixel areas 2000 corresponding to the blue pixels B defined in the substrate 110, and all trench areas 1000.

As the result, in the color filter plate 550, the pixel area 2000 corresponds to the emission area EA, and the trench area 1000 corresponds to the non-emission area NEA.

Second Embodiment

Figure 8:
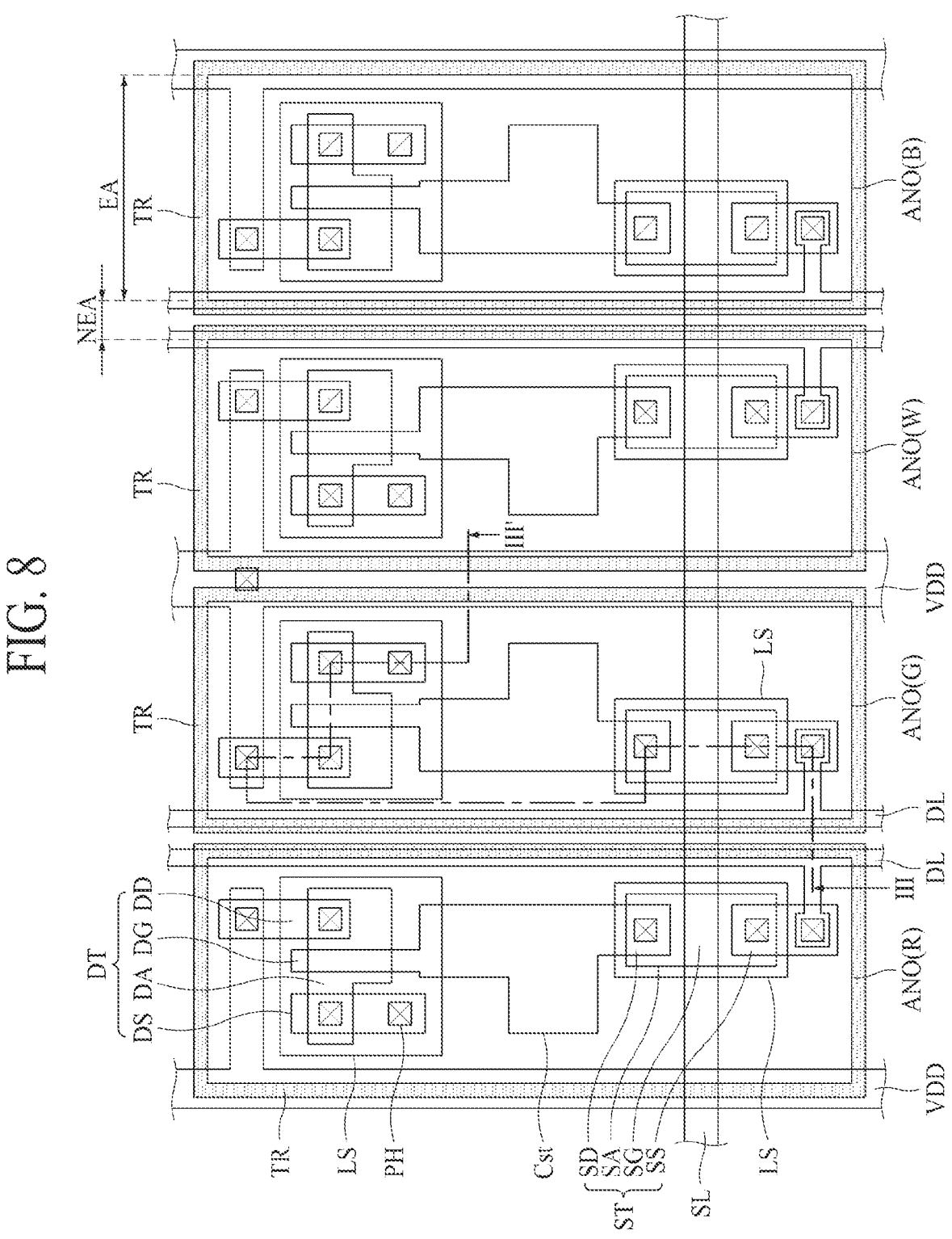
FIG. 8 is a plan view illustrating a structure of the sub-pixels disposed in the light emitting display device according to a second embodiment of the present disclosure.
Figure 9:
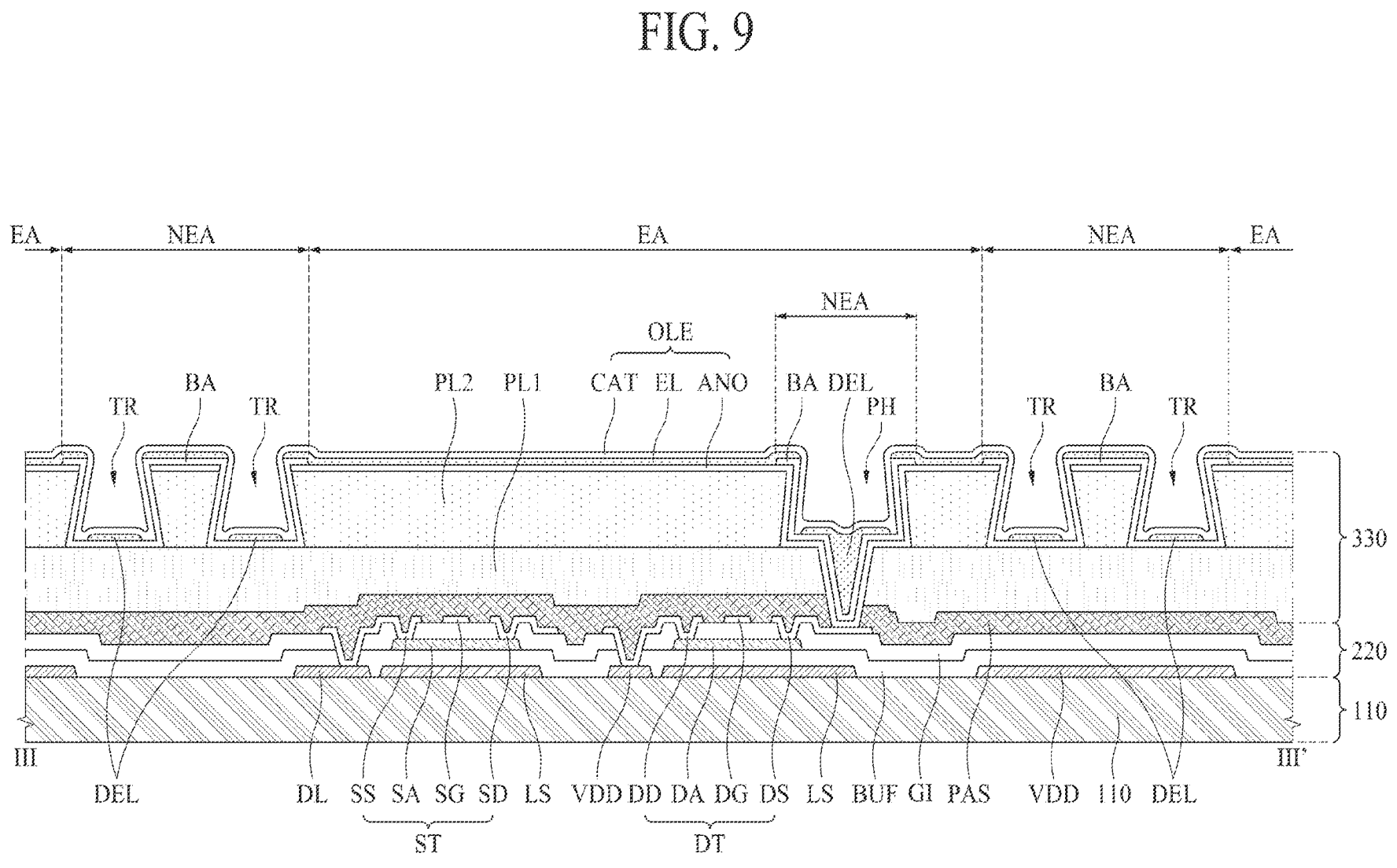

Hereinafter, referring to FIGS. 8 and 9, a second embodiment of the present disclosure will be described. FIG. 8 is a plan view illustrating a structure of the sub-pixels disposed in the light emitting display device according to a second embodiment of the present disclosure. FIG. 9 is a cross-sectional view along line III-III' shown in FIG. 8.

The planar structure of the light emitting display device according to the second embodiment shown in FIG. 8 is very similar with that of the first embodiment. The difference is that the arrangement structure of the trench TR.

As for the arrangement structure of the trench TR, in the second embodiment, each anode electrode ANO formed at each pixel R, G, W and B are surrounded by the trench TR separated each other. In the cross-sectional view, the edge of the anode electrode ANO is patterned to aligned with the side wall of the trench TR. That is, the anode electrode ANO disposed at each pixel may be defined by the trench TR. At each of neighboring two pixels, one anode electrode ANO is disposed as being surrounded by individual trench TR. Since the other elements are the same as those of the first embodiment, redundant descriptions are not duplicated.

Referring to FIG. 9, anode electrode ANO defined at each pixel may be surrounded by individual trench TR. Therefore, two trenches TR may be disposed between neighboring two pixels.

Between two neighboring trenches TR disposed in one non-emission area NEA, the second planarization layer PL2 is disposed. On this portion of the second planarization layer, an electrode layer same as the anode electrode ANO, the bank BA, the emission layer EL and the cathode electrode CAT are stacked. However, as the bank BA is an insulating material, no light is emitted from this portion. Since the bank BA is not stacked on the upper surface of the second planarization layer PL2 at this portion, the anode electrode ANO, the emission layer EL and the cathode electrode CAT may be stacked. In that case, as the anode electrode ANO is not connected to the anode electrode ANO of the neighboring pixel, the driving voltage is not supplied to the neighboring pixel. Therefore, at the area between neighboring two the trenches TR in non-emission area NEA, light emission does not occur.

In the first embodiment, only one trench TR is disposed between two neighboring pixels (or emission areas EA), so an area ratio occupied by the emission area EA may be greater than that of the second embodiment in which two trenches TR are disposed between two neighboring pixels. Accordingly, the first embodiment is a structure suitable for a light emitting display device requiring a high aperture ratio or high luminance.

In the second embodiment, two trenches TR are disposed between two neighboring pixels (or emission area EA), so the disconnection of the emission layer EL between neighboring pixels may be more reliably ensured. That is, the horizontal leakage current may be suppressed more reliably than the first embodiment. Accordingly, the second embodiment is a structure suitable for a light emitting display device that needs to more reliably prevent image quality deterioration or damage due to horizontal leakage current even though the aperture ratio or luminance is somewhat lowered.

Figure 10:
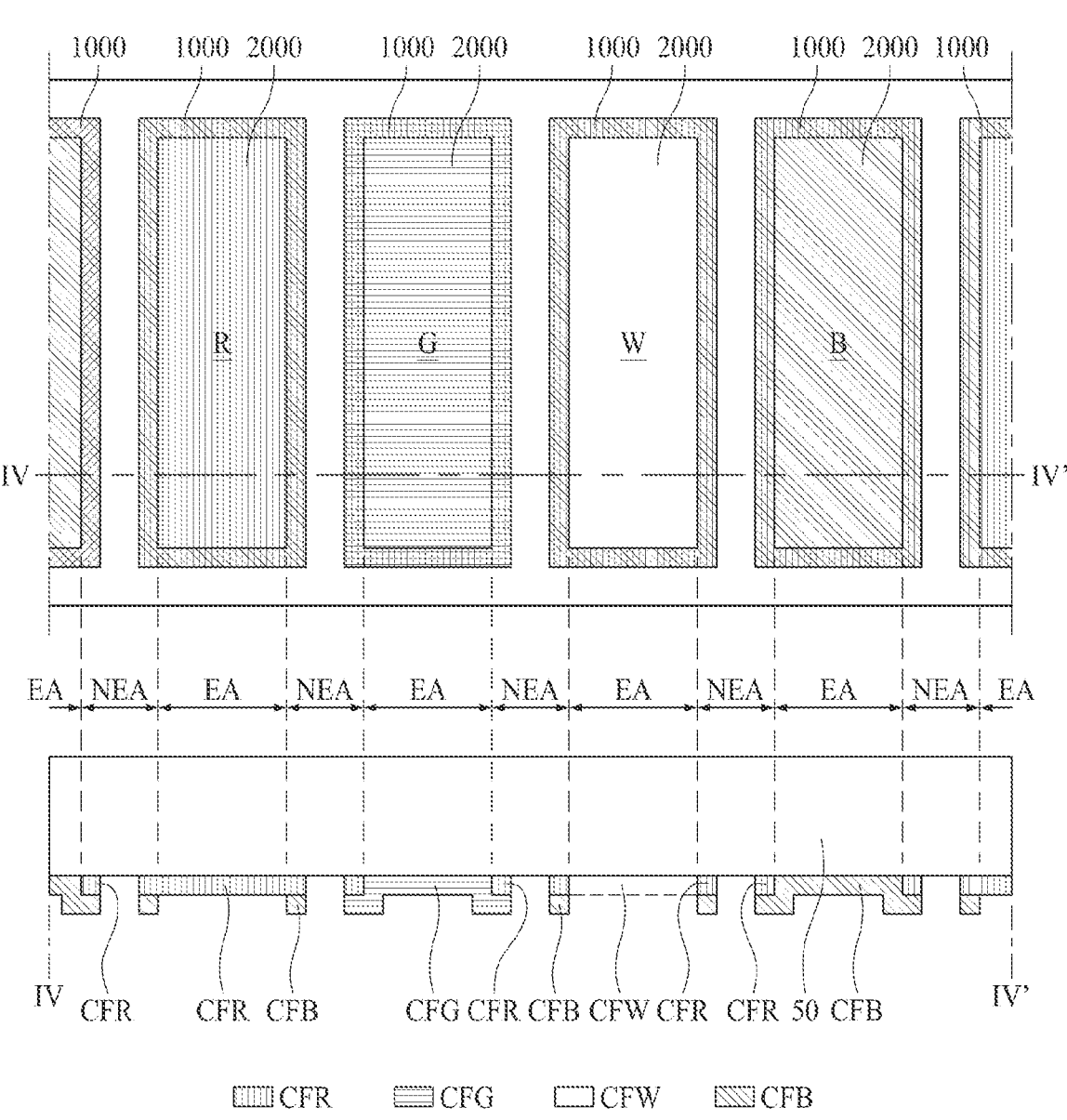
FIG. 10 is a plane view and a cross-sectional view illustrating an exemplary structure of color filters in the light emitting display device according the second embodiment of the present disclosure.

Hereinafter, referring to FIG. 10, an exemplary structure of the upper substrate in which color filters are disposed according to the second embodiment will be explained. FIG. 10 is a plane view and a cross-sectional view illustrating an exemplary structure of color filters in the light emitting display device according the second embodiment of the present disclosure.

Referring to FIG. 10, an upper substrate 50 may include a plurality of pixel areas 2000. Circumference of each pixel area 2000 have individual trench area 1000. Each pixel area 2000 may correspond to each anode electrode ANO disposed in each pixel defined at the substrate 110. Each trench area 1000 may correspond to each trench TR disposed at the substrate 110.

The red color filter CFR may be disposed at pixel areas 2000 corresponding to the red pixels R defined in the substrate 110, and all trench areas 1000. The green color filter CFG may be disposed at pixel areas 2000 corresponding to the green pixels G defined in the substrate 110, and to the trench area 1000 corresponding to trench TR surrounding the green pixel G. The white color filter CFW may be disposed at pixel areas 2000 corresponding to the white pixel W defined in the substrate 110. The blue color filter CFB may be disposed at pixel areas 2000 corresponding to the blue pixel B defined in the substrate 110, and trench areas 1000 surrounding the red pixel R and the white pixel W.

As the result, in the color filter plate 550, the pixel area 2000 corresponds to the emission area EA, and the trench area 1000 corresponds to the non-emission area NEA. A color filter may not be disposed between two adjacent trench areas 1000. However, since no light emitting element is disposed in this portion and an anode electrode ANO having a low reflection structure is disposed in this portion, external light reflection does not occur.

Figure 11:
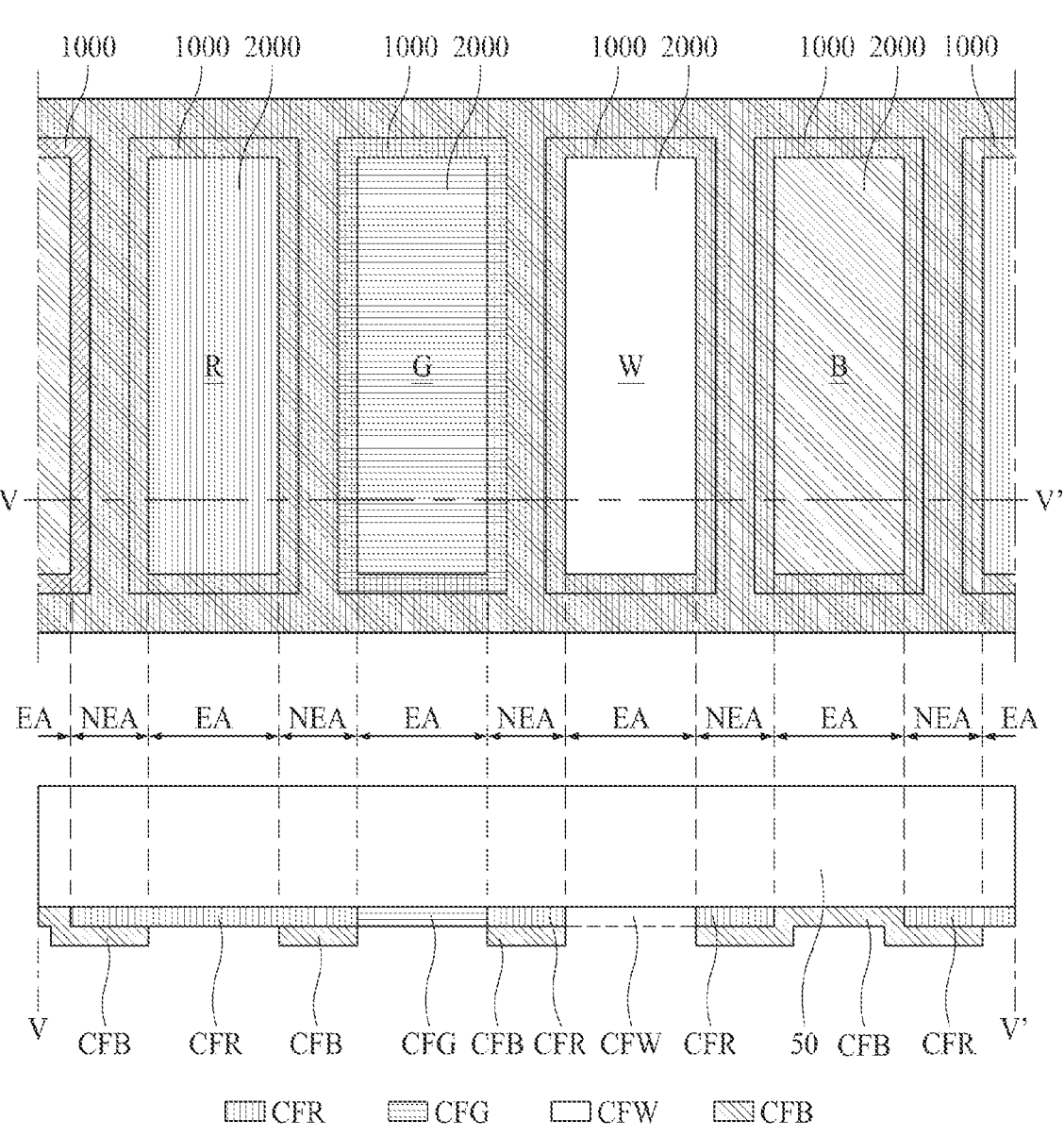
FIG. 11 is a plane view and a cross-sectional view illustrating another exemplary structure of color filters in the light emitting display device according the second embodiment of the present disclosure.

Hereinafter, referring to FIG. 11, another exemplary structure of the upper substrate in which color filters are disposed according to the second embodiment will be explained. FIG. 11 is a plane view and a cross-sectional view illustrating another exemplary structure of color filters in the light emitting display device according the second embodiment of the present disclosure.

The structure of the upper substrate 50 with the color filter shown in FIG. 11 is substantially the same as the structure of the upper substrate 50 with the color filter according to the first embodiment shown in FIG. 7. That is, it may be understood that the upper substrate 50 according to the first embodiment may be applied to the second embodiment as it is.

In the light emitting display device according to various embodiments of the present disclosure, the horizontal leakage current is prevented by trenches disposed between pixels even when ultra-high resolution (over 4K density of pixels) is implemented. Accordingly, an ultra-high resolution display device having excellent image quality is provided. In addition, the present disclosure provides a display device having an external light reflection suppression structure by and anode electrode. Specifically, since at least two color filters are stacked in the trench area to have a structure to suppress external light reflection, image quality distortion due to external light reflection may be prevented.

The features, structures, effects and so on described in the above example embodiments of the present disclosure are included in at least one example embodiment of the present disclosure, and are not necessarily limited to only one example embodiment. Furthermore, the features, structures, effects and the like explained in at least one example embodiment may be implemented in combination or modification with respect to other example embodiments by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that embodiments of the present disclosure cover the various substitutions, modifications, and variations of the present disclosure, provided they come within the scope of the appended claims and their equivalents. These and other changes can be made to the embodiments in light of the above detailed description. In general, in the following claims, the terms used should not be construed to limit the claims to the specific example embodiments disclosed in the specification and the claims, but should be construed to include all possible embodiments along with the full scope of equivalents to which such claims are entitled. Accordingly, the claims are not limited by the disclosure.

What is claimed is:

1. A light emitting display device comprising:
a first pixel and a second pixel disposed on a substrate;
a first electrode disposed in each of the first pixel and the second pixel;
a trench disposed between the first pixel and the second pixel;
a bank disposed at circumferences of the first pixel and inside of the trench; and
an emission layer on the first electrode and an upper surface of the bank,
wherein the first electrode includes:
a reflection layer on the substrate;
a transparent layer on the reflection layer; and
a semi-transparent layer on the transparent layer.

2. The light emitting display device according to claim 1, further comprising:
a second electrode disposed on the emission layer;
an encapsulation layer disposed on the second electrode;
a filling layer disposed on the encapsulation layer; and
an upper substrate disposed on the filling layer.

3. The light emitting display device according to claim 2, wherein the upper substrate includes:
a first color filter corresponding to the first pixel and disposed on an inner surface of the upper substrate; and
a second color filter corresponding to the second pixel,
wherein the first color filter and the second color filter are stacked at areas corresponding to the trench.

4. A light emitting display device comprising:
a pixel on a substrate;
a first electrode in the pixel;
a trench surrounding the pixel;
an emission layer on the first electrode;
a second electrode on the emission layer; and
an insulating layer at the trench and around the trench,
wherein the first electrode has a circumference abutting a side wall of the trench, and is electrically separated from the second electrode.

5. The light emitting display device according to claim 4, wherein the emission layer is disconnected by the trench.

6. The light emitting display device according to claim 4, further comprising:
a planarization layer between the substrate and the first electrode,
wherein the trench is formed at the planarization layer.

7. The light emitting display device according to claim 6, wherein the side wall of the trench is inclined from an upper surface of the planarization layer.

8. The light emitting display device according to claim 6, wherein a circumference of the first electrode covers a side wall of the trench inclined from an upper surface of the planarization layer, and is covered by the insulating layer.

9. The light emitting display device according to claim 6, wherein the planarization layer includes:
a first planarization layer between the substrate and the first electrode; and
a second planarization layer between the first planarization layer and the first electrode,
wherein the trench is formed at the second planarization layer.

10. The light emitting display device according to claim 9, wherein a circumference of the first electrode covers the side wall of the trench slanted from an upper surface of the second planarization layer, and wherein the insulating layer covers the circumference of the first electrode and the second planarization layer exposed from the trench.

11. The light emitting display device according to claim 1, wherein the trench surrounds the first electrode.

12. The light emitting display device according to claim 1, wherein the first electrode is separated per each pixel by the trench, wherein the emission layer is separated by trench, and wherein the second electrode connects two neighboring pixels and the trench between the two neighboring pixels.

13. The light emitting display device according to claim 1, wherein the semi-transparent layer includes a molybdenum-titanium alloy having a thickness of 50 Å to 100 Å, wherein the transparent layer includes an indium-zinc-oxide having a thickness of 300 Å to 800 Å, and wherein the reflection layer includes a molybdenum-titanium alloy having a thickness of 1,000 Å to 2,000 Å.

14. The light emitting display device according to claim 1, further comprising:

a first transparent conductive layer disposed under the reflection layer; and a second transparent conductive layer disposed on the semi-transparent layer.

15. The light emitting display device according to claim 14, wherein the first transparent conductive layer and the second transparent conductive layer include indium-zinc-oxide material having a thickness of 100 Å to 200 Å.

16. The light emitting display device according to claim 1, wherein, in the trench, the bank is formed at a bottom surface of the trench, wherein a dummy emission layer, which is a part of the emission layer, is disposed on the bank, and wherein the second electrode is disposed on the dummy emission layer.

17. The light emitting display device according to claim 1, further comprising:

a driving element layer on the substrate;

a first planarization layer on the driving element layer; and a second planarization layer on the first planarization layer, wherein the first electrode is on the second planarization layer, wherein the trench is formed by removing some of the second planarization layer.

18. The light emitting display device according to claim 1, wherein the trench has a reverse-tapered shape in which a lower portion is wider than an upper portion.

19. The light emitting display device according to claim 1, further comprising:

a first color filter corresponding to the pixel and the trench; and a second color filter disposed at another pixel neighboring the pixel, and overlaps some of the first color filter, wherein the first color filter and the second color filter overlap with each other at an area corresponding to the trench.

* * * * *